US011177216B2

(12) United States Patent
LaRoche et al.

(10) Patent No.: US 11,177,216 B2
(45) Date of Patent: Nov. 16, 2021

(54) NITRIDE STRUCTURES HAVING LOW CAPACITANCE GATE CONTACTS INTEGRATED WITH COPPER DAMASCENE STRUCTURES

(71) Applicant: Raytheon Company, Waltham, MA (US)

(72) Inventors: Jeffrey R. LaRoche, Austin, TX (US); Eduardo M. Chumbes, Andover, MA (US); Kelly P. Ip, Lowell, MA (US); Thomas E. Kazior, Sudbury, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/123,429

(22) Filed: Sep. 6, 2018

(65) Prior Publication Data

US 2020/0083167 A1    Mar. 12, 2020

(51) Int. Cl.
*H01L 23/535* (2006.01)
*H01L 23/528* (2006.01)
(Continued)

(52) U.S. Cl.
CPC .......... *H01L 23/535* (2013.01); *H01L 23/528* (2013.01); *H01L 23/53228* (2013.01);
(Continued)

(58) Field of Classification Search
CPC ................. H01L 29/402; H01L 29/404; H01L 29/42312; H01L 29/43; H01L 23/528;
(Continued)

(56) References Cited

U.S. PATENT DOCUMENTS

| 5,652,157 A | 7/1997 | Hirano et al. |
| 5,858,824 A | 1/1999 | Saitoh |

(Continued)

FOREIGN PATENT DOCUMENTS

| EP | 0 715 346 A2 | 6/1996 | |
| JP | 2019075452 A | * 5/2019 | ......... H01L 21/0217 |

OTHER PUBLICATIONS

PCT International Search Report and Written Opinion dated Oct. 16, 2019 for International Application No. PCT/US2019/044604; 12 Pages.

(Continued)

*Primary Examiner* — Sarah K Salerno
(74) *Attorney, Agent, or Firm* — Daly, Crowley, Mofford & Durkee, LLP

(57) ABSTRACT

A semiconductor structure having: a Group III-N semiconductor; a first dielectric disposed in direct contact with the Group III-N semiconductor; a second dielectric disposed over the first dielectric, the first dielectric having a higher dielectric constant than the second dielectric; a third dielectric layer disposed on the first dielectric layer, such third dielectric layer having sidewall abutting sides of the second dielectric layer; and a gate electrode contact structure. The gate electrode structure comprises: stem portion passing through, and in contact with, the first dielectric and the second dielectric having bottom in contact with the Group III-V semiconductor; and, an upper, horizontal portion extending beyond the stem portion and abutting sides of the third dielectric layer. An electrical interconnect structure has side portions passing through and in contact with the third dielectric layer and has a bottom portion in contact with the horizontal portion of the gate electrode contact structure.

34 Claims, 25 Drawing Sheets

(51) Int. Cl.
    *H01L 23/532* (2006.01)
    *H01L 29/20* (2006.01)
    *H01L 29/778* (2006.01)

(52) U.S. Cl.
    CPC .... *H01L 23/53295* (2013.01); *H01L 29/2003* (2013.01); *H01L 29/7786* (2013.01)

(58) Field of Classification Search
    CPC ............. H01L 27/098; H01L 21/28587; H01L 29/475; H01L 29/7786; H01L 29/452; H01L 23/53295
    See application file for complete search history.

(56) References Cited

U.S. PATENT DOCUMENTS

| | | | |
|---|---|---|---|
| 6,159,781 A | 12/2000 | Pan et al. | |
| 6,740,535 B2 | 5/2004 | Singh et al. | |
| 7,834,456 B2 | 11/2010 | Tabatabaie et al. | |
| 9,478,508 B1 | 10/2016 | LaRoche et al. | |
| 2003/0173584 A1* | 9/2003 | Nikaido | H01L 21/28575 257/194 |
| 2004/0016972 A1 | 1/2004 | Singh et al. | |
| 2011/0092057 A1* | 4/2011 | Suvorov | H01L 21/0465 438/522 |
| 2012/0068793 A1 | 3/2012 | Chen et al. | |
| 2013/0277680 A1* | 10/2013 | Green | H01L 29/402 257/76 |
| 2015/0137135 A1* | 5/2015 | Green | H01L 29/66431 257/76 |
| 2015/0235856 A1 | 8/2015 | Hwang et al. | |
| 2015/0318387 A1* | 11/2015 | Chiu | H01L 29/205 257/76 |
| 2016/0071809 A1 | 3/2016 | Fillmore et al. | |
| 2017/0025278 A1 | 1/2017 | Hwang et al. | |
| 2018/0240754 A1 | 8/2018 | LaRoche et al. | |
| 2019/0097001 A1* | 3/2019 | LaRoche | H01L 21/28575 |

OTHER PUBLICATIONS

Allowance Decision of Examination with English Translation, Application No. 108124864, dated Nov. 20, 2020, 3 pages.

* cited by examiner

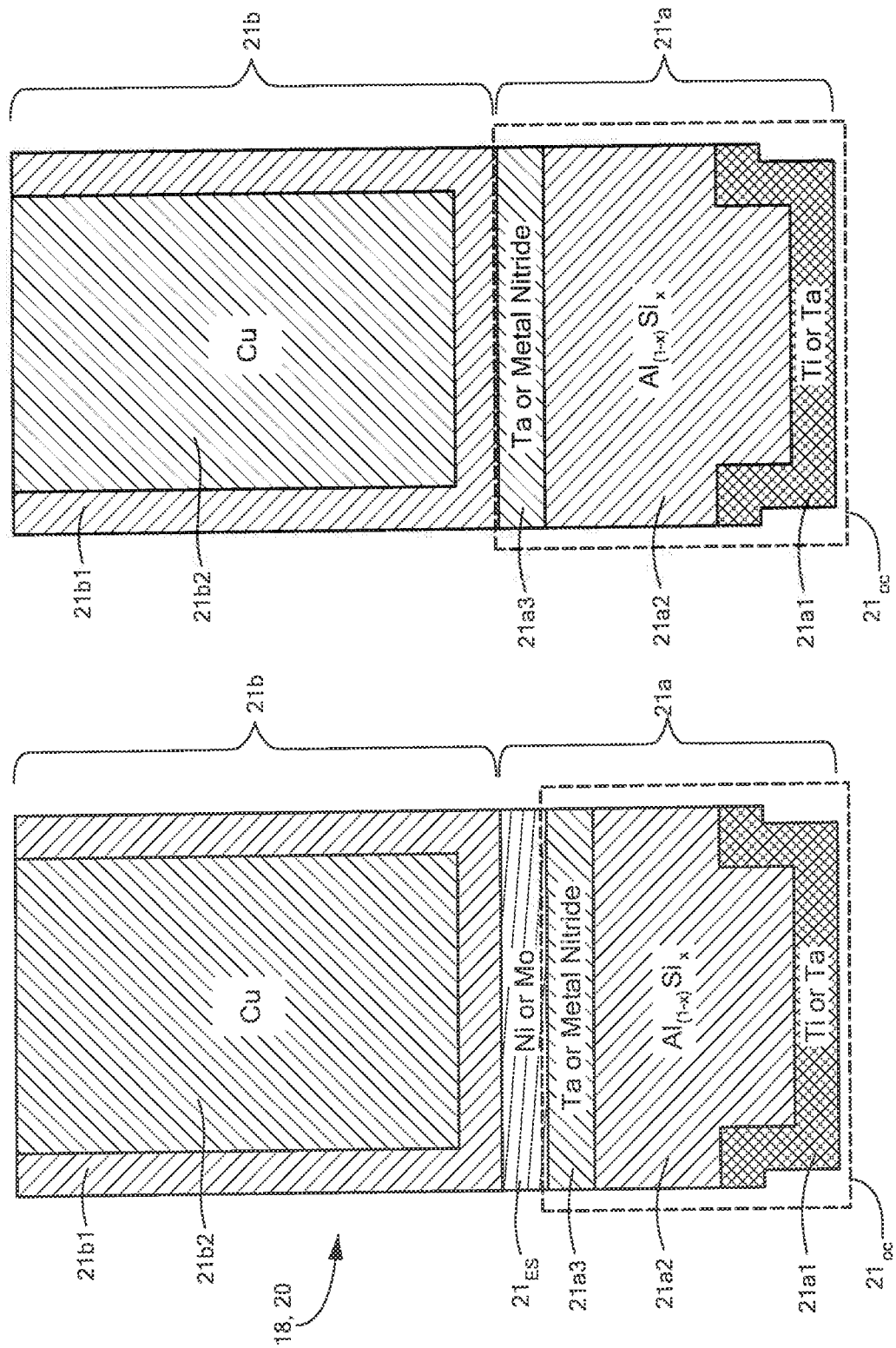

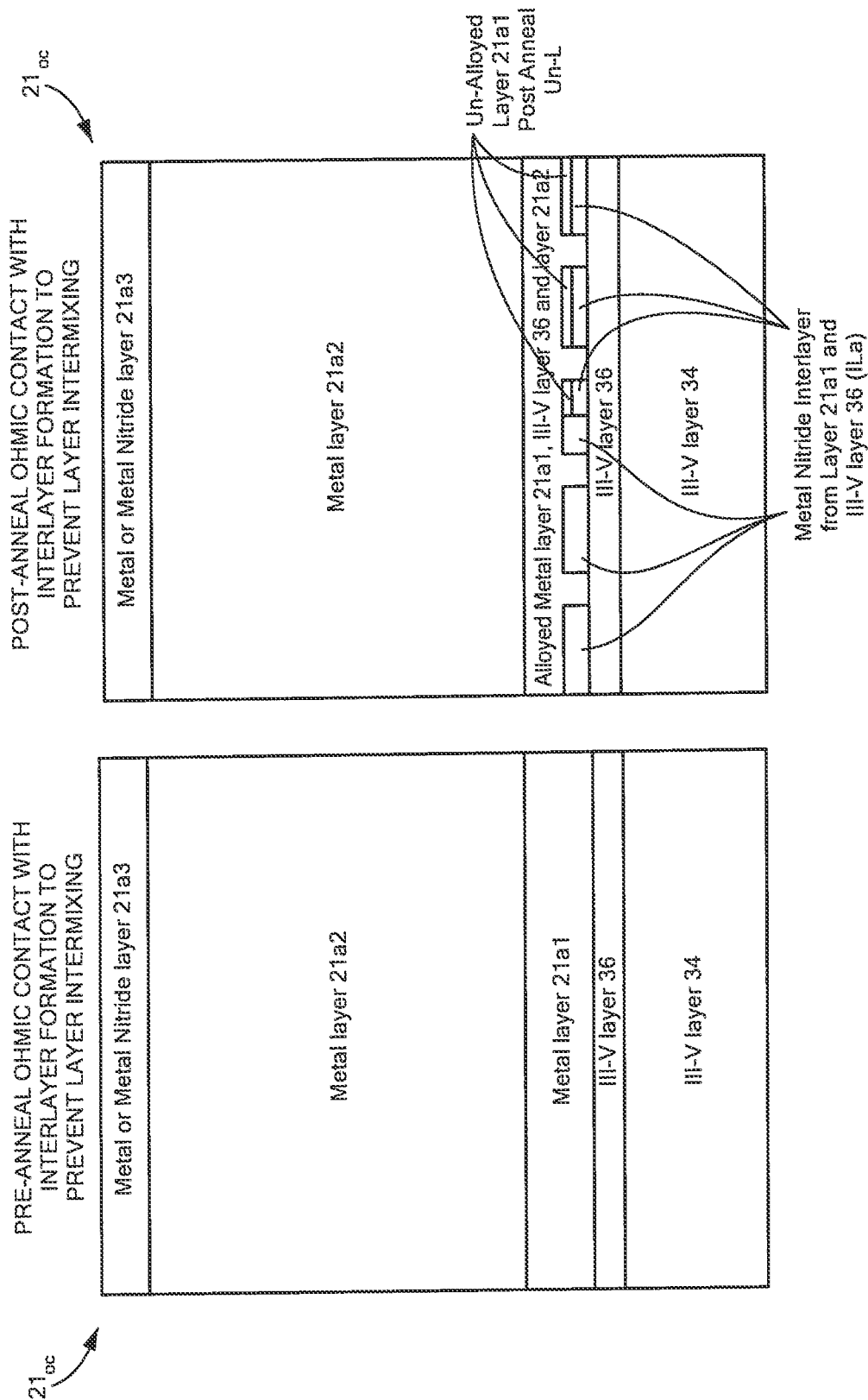

NITRIDE STRUCTURES HAVING LOW CAPACITANCE GATE CONTACTS INTEGRATED WITH COPPER DAMASCENE STRUCTURES

TECHNICAL FIELD

This disclosure relates generally to low capacitance gate structures having a gold-free electrical contact structure in contact with an upper surface of a Nitride and connected to copper Damascene based interconnects.

BACKGROUND

As is known in the art, many monolithic microwave integrated circuits (MMICs) having Group III-Nitride semiconductors, sometimes referred to as nitride semiconductors, such as for example, gallium nitride-based (AlGaN/GaN) high electron mobility transistors (HEMTs), are increasingly being used for high-frequency and high-power applications. Group III-Nitride are herein after sometimes also referred to as Group III-N which includes, for example, binaries InN, GaN, AlN, their ternary alloys such as $Al_xGa_{1-x}$N (AlGaN) alloys and other nitrogen based alloys.

In order to realize the potential of these HEMT devices it is necessary to achieve low-resistance, good edge acuity and reliable metal to metal contacts, and metal to semiconductor Ohmic contacts. Most Group III-N foundry metal to metal and metal to semiconductor low resistance Ohmic contacts use gold (Au) to reduce sheet resistance (for transmission lines and Ohmic contacts) and to decrease oxidation during the high temperature anneal required to achieve the lowest metal to semiconductor Ohmic contact resistance to active devices.

As is also known, in many Monolithic Microwave Integrated Circuits (MMICs) and other integrated circuits (ICs), electrical connection is made to the bottom of the MMIC for both ground and electrical signals to mounted chips, these connections are made through electrically conductive vias passing through the substrate and/or a semiconductor epitaxial layer on at least a portion of the substrate to electrical contacts that connect the vias to a metallization on the wafer; sometimes referred to as a front-side metallization.

Traditionally, Group III-N HEMT MMICs and devices are fabricated by liftoff-based processing in III-V foundries. Recently, however, Group III-N HEMTs have begun to be fabricated using high yield silicon-like, Au-free, subtractive processing techniques in Si CMOS foundry environments. More particularly, a "lift-off" process is where a mask has a window to expose a selected portion of a surface where a material is to be deposited. The material is deposited onto the mask with a portion of the material passing through the window onto the exposed selected portion of the surface. The mask is lifted off the surface with a solvent along with portion of the material on the mask (the unwanted portion of the deposited material) while leaving the desired portion of the material on the exposed selected portion of the surface. A "subtractive" process is where a material is first deposited over the entire surface. Then a mask is formed to cover only over a selected portion of the deposited material (the portion which is to remain after the processing); the unwanted portions of the deposited material being exposed. An etchant is then brought into contact with the mask thereby removing the exposed unwanted portion while the mask prevents the etchant from removing the covered desired portion of the material.

Relative to Si CMOS foundries, it is well known that the yield and cost of III-V compound semiconductor devices and circuits (processed in traditional III-V foundries) has long been limited by low wafer volumes, increased substrate handling during processing, the use of time consuming electron beam lithography for sub 500 nm gate lithography, and the widespread use of liftoff-based processing techniques to define metal lines. The Si CMOS foundry environment on the other hand has the benefit of high wafer volumes, large wafer diameters (≥200 mm), highly automated cassette to cassette wafer fabrication or processing tools, advanced optical lithography cluster tools and techniques (capable of defining sub 100 nm features), the Moore's law paradigm that drives both equipment development and technology node development and high-yield subtractive processing techniques.

Factors that impact the yield of "lift-off" processes relative to higher yield subtractive processes include residue from masking materials such as photo or electron beam sensitive resists or hard mask materials. These residues may reside in windows between the desired contact interface (e.g. semiconductor surfaces and previously deposited metals) and the films subsequently deposited; here for example contact and interconnect metal layers, dielectric stop etch stop etch layers, and semiconductor layers. Other defects from "lift-off" processes include un-lifted metal outside the window area, and ragged/jagged metal at the edge of windows (common referred to as "fencing"), that are often the result of poor mask sidewall profiles at the edge of the window area, or mask layers that are too thin for the desired layer thickness of the deposited layer.

Often, the primary driver of yield in the fabrication of semiconductor devices that utilize liftoff are the smallest device features; here for example sub-micron features. These features tend to be more sensitive to the defects associated with "lift-off" that were discussed previously. This is because the small features tend to have thinner resists, whose post exposure window surfaces tend be more difficult to clean without impacting the following: the mask sidewall profile, the overall thickness of the mask, or desired lateral/critical feature sizes of the window. High performance transistor processes often face many if not all these difficulties due to the fact that it desirable to minimize both the capacitance and resistance of the fabricated gate. More specifically, to minimize capacitance, it is desirable to have a gate structure that has a small gate contact; here for example a submicron feature that is comprised of a metal, in contact with the surface of the semiconductor or in contact with a gate dielectric that is in contact with the semiconductor. Additionally, to minimize the gate resistance, it is often necessary for this small gate contact structure to support a larger metal electrode structure that is disposed above it and in electrical contact to it. This electrode structure is commonly referred to as a gate top and has a portion (a gate top metal overhang) that extends laterally from the edge of one or both sides of the gate contact. An additional complication, however, is that the gate top induces additional capacitance determined primarily by the dielectric constant of any dielectrics and air/free space below gate top metal overhang and the distance of the overhang from the top surface of the semiconductor. As a result, the gate top metal overhang has to be sufficiently far from the surface of the semiconductor so that the total capacitance of the gate structure (gate contact and gate top metal overhang) is minimized to achieve the desired performance of the semiconductor device at a given frequency or range of frequencies.

In many FETs, the entire gate structure, contact and electrode/gate top, is often referred to a T-gate (having a vertical stem and a horizontal member, sometimes referred to as a gate top or bar, disposed on the top of the step where the gate top is centered over the gate stem), or as Gamma-gate when the gate top is shifted to one side of the gate; here for example to the drain side of the gate, in order shape the field at the edge of the gate to maximize the device breakdown.

Another critical aspect of III-V and III-N transistor fabrication is passivation of the access regions between the source Ohmic contact and gate contact and between the gate contact and drain Ohmic contact. Passivation, when properly executed in conjunction with pre-deposition surface cleans, is the use of an insulating layer; here for example Silicon Nitride (SiNx) or Al2O3 that terminates surface defects (e.g. traps). The defects could otherwise lead to reliability issues, gate leakage, and current collapse (also known as dispersion) and gate leakage. In particular, current collapse can be particularly challenging in high voltage III-V, and III-N devices with passivated access regions; here for example pseudomorphic HEMTs (PHEMTs) and GaN HEMTs. Current collapse generally increases high gate to drain biases and high drive (large signal) conditions under operation; here for example 250 nm GaN gates can be biased to ≥28V on the drain and operate reliably. Essentially as the device is pinched off under large signal conditions and high drain biases, surface states at the semiconductor interface become charged, and acts as a parasitic gate that suppresses current flow in the device until the discharge time constant of the trap is exceeded. This effect can drastically impair the performance of poorly passivated devices that have a high number of surface defects.

GaN HEMTs are particularly challenging to passivate because the channel charge in GaN HEMTs is due to spontaneous and piezoelectric polarization of the AlGaN/GaN material system. More specifically, the spontaneous polarization of Gallium faced (Ga) surfaces of the top layer of GaN HEMTs results in carriers being transferred from the top surface of the AlGaN barrier layer (or thin GaN capping layer above the AlGaN). Additional carriers are added to the channel due to the fact that the piezoelectric polarization of the AlGaN layer aligns with its spontaneous polarization due to the fact that the AlGaN layer is under tensile strain from the GaN buffer. As a result, the carrier density in the channels of GaN HEMT devices is very tightly coupled to the defectivity (e.g. interface states) of at the semiconductor passivation interface. Silicon Nitride, $SiN_x$, is the most widely used passivation layer used for reliable, high-voltage, low dispersion GaN HEMT technology. It is also the most commonly used passivation layer for other III-V and III-N device technologies.

Another aspect of II-V foundry processes as compared to Si-foundry processes, as noted previously, is that to take advantage of the benefits of the Si foundry infrastructure and background Si CMOS wafer volumes, the developed Group III-N processes have to be Au-free. Gold is a deep level trap dopant in Si. Therefore, Au is not allowed in the front end or back end of Si CMOS foundry fabrication lines as it is a serious contamination concern that can cause catastrophic yield problems.

Gold free processing of GaN (or other III-V) device wafers in Si foundry environments therefore requires the use of Si foundry back end of line (BEOL) compatible metallizations such as aluminum (Al) or copper (Cu). Copper is the most attractive of these metals to use as it has superior electrical conductivity and electro-migration resistance. However, because of the lack of volatile copper dry etch by-products, copper cannot readily be subtractively patterned by the techniques of photolithography wherein photoresist masking and plasma etching have been used with great success with aluminum. To process copper, the Damascene process (which is also subtractive), was developed. In the Cu Damascene process, a host insulator material for the copper, typically an underlying insulating layer (usually silicon dioxide), is patterned with open trenches where the copper is to be formed. A thick coating of copper that significantly overfills the trenches is deposited on the insulating layer, and chemical-mechanical planarization (CMP) is used to remove the excess copper that extends above the top of the insulating layer. Cu filled within the trenches of the insulating layer is not removed and becomes the patterned conductive interconnect.

As is also known in the art, while Cu is manageable, it also poses its own contamination risk for Si foundries. Barrier layers should completely surround all copper interconnections, since diffusion of copper into surrounding materials would degrade their properties. Typically, the trenches are lined with thin tantalum (Ta) and/or tantalum nitride (TaN) metal layers (as part of the Ta/TaN/Cu plating seed metal stack) to act as diffusion barriers along the bottom and sides of the Cu metal interconnects. At post Cu CMP the top of the interconnect metal is coated with SiNs to act as the top interface diffusion barrier, to prevent oxidation during interlayer oxide deposition, and to act as a stop etch layer (during the trench etch of the silicon dioxide) for additional interconnect formation. Additional process complications arise, however, when back to front side metal interconnects are facilitated by through-wafer or through-semiconductor layer vias that require a chlorine-(or other oxidizer) based etches to form these vias. The chloride-based etch by-products are nonvolatile and the etch process results in a degraded Cu interfacial surface.

Examples of prior art that have addressed the performance of T-gates include the following: U.S. Pat. No. 6,740,535 B2 by Singh et al; U.S. Pat. No. 6,159,781 by Pan et al; U.S. Pat. No. 5,652,157, by Hirano et al, issued Jul. 29, 1997, and U.S. Published Patent Application 2015/0235856A1 by Hwang et al., published Aug. 20, 2015.

SUMMARY

In accordance with the disclosure, a semiconductor structure is provided having: a Group III-N semiconductor; a first dielectric disposed in direct contact with the Group III-N semiconductor; second dielectric disposed over the first dielectric, the first dielectric having a higher dielectric constant than the second dielectric; a third dielectric layer disposed on the first dielectric layer, such third dielectric layer having sidewall abutting sides of the second dielectric layer; and a gate electrode contact structure. The gate electrode structure comprises: a lower, vertically extending stem portion, sidewalls of the stem portion passing through, and in contact with, a portion of the first dielectric and a portion of the second dielectric, a bottom of the stem portion being in contact with the Group III-V semiconductor; and, an upper, horizontal portion disposed on a top portion of the lower, vertically extending stem portion, a portion of the upper, horizontal portion extending horizontally beyond the lower, vertically extending stem portion and abutting sides of the third dielectric layer. The portion of the upper, horizontal portion that extends horizontally beyond the lower, vertically extending stem portion is disposed over a both a portion of the second dielectric and a portion of the first dielectric disposed under the second dielectric. An electrical interconnect structure has side portions passing through and in contact with the third dielectric layer and has a bottom portion in contact with the upper, horizontally portion of the gate electrode contact structure.

With such structure, the first dielectric provides a passivation layer, the second dielectric layer having a lower dielectric constant thereby providing a structure having both a passivation layer and a T-gate, or Gamma gate, with a low capacitance, and an electrical interconnect structure passing through and is in contact with the third dielectric layer and has a bottom portion in contact with the upper, horizontally portion of the gate electrode contact structure the third dielectric layer.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 2F'-2L' are simplified, diagrammatical sketches of a semiconductor structure according to an alternative embodiment of the disclosure, such steps being subsequent to the fabrication of the structure shown in FIG. 2E at various stages in such subsequent fabrication thereof;

FIGS. 2F", 2G" and 2H" are simplified, diagrammatical sketches of a semiconductor structure according to still another alternative embodiment of the disclosure, such steps being subsequent to the fabrication of the structure shown in FIG. 2F at various stages in such subsequent fabrication thereof;

FIG. 3A a diagrammatical, cross-sectional sketch of an electrodes used as source and drain electrode structures in the structure of FIGS. 2A through 2K according to the disclosure;

FIGS. 3A' a diagrammatical, cross-sectional sketch of an electrodes used as source and drain electrode structures in the structure of FIGS. 2A through 2K according to the another embodiment of the disclosure;

FIGS. 4A and 4A' is a pair of diagrammatical cross sectional sketches useful in understanding a low temperature anneal process used in forming the semiconductor structure according to the disclosure.

Like reference symbols in the various drawings indicate like elements.

DETAILED DESCRIPTION

Figure 1:
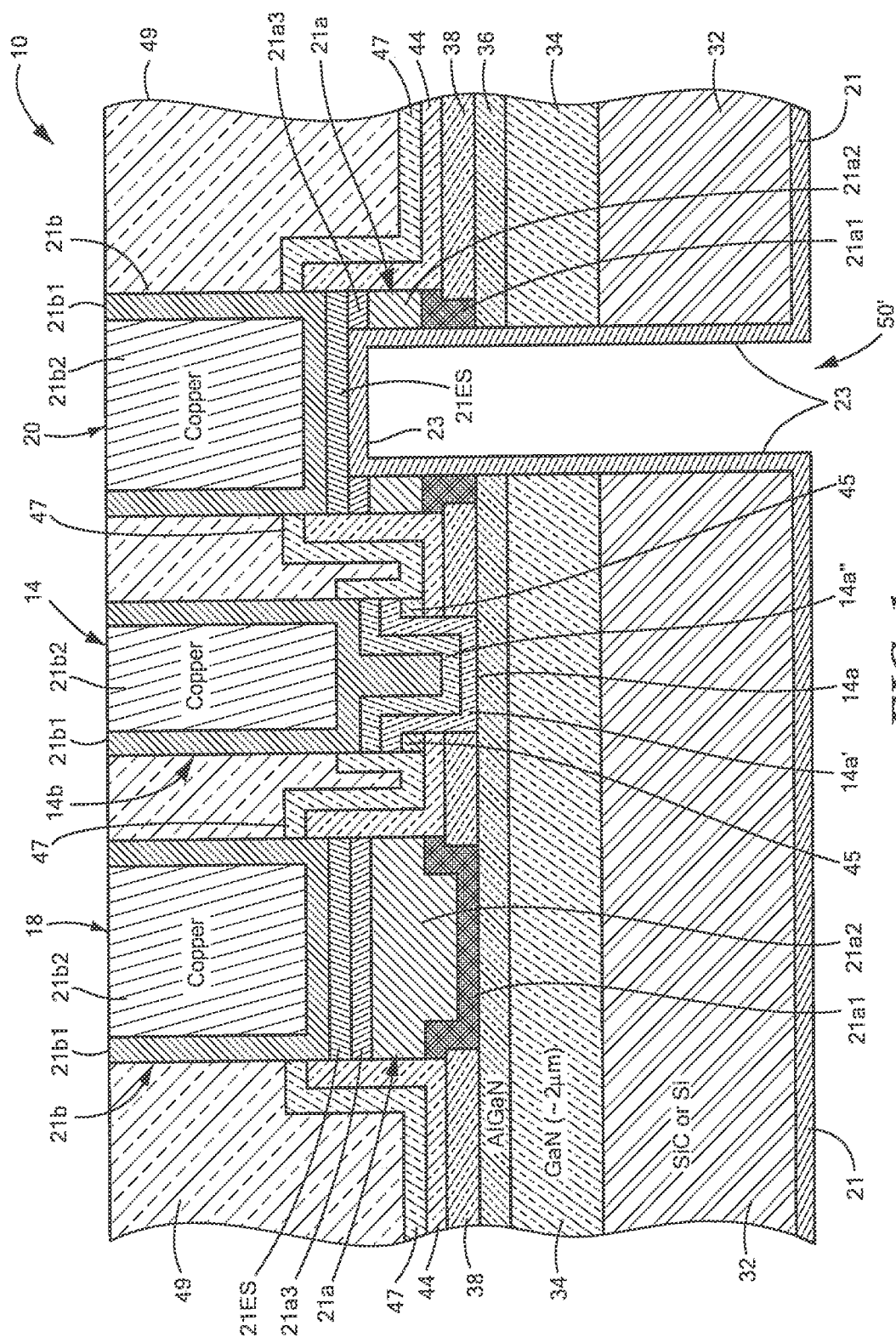
FIG. 1 is a simplified, diagrammatical sketch of a semiconductor structure having formed therein Field Effect Transistor (FET) according to the disclosure.

Referring now to FIG. 1, a semiconductor structure 10 is shown having formed therein Field Effect Transistor (FET), here a HEMT. The FET includes a gold-free gate electrode structure 14; a gold-free drain electrode structure 18; and a gold-free source electrode structure 20. The gate electrode structure 14 is disposed between the drain electrode structure 18 the source electrode structure 20 to control a flow of carriers in the semiconductor structure 10 between the source electrode structure 20 and the drain electrode structure 18. Here, in this example, the FET is configured as a common source FET; more particularly, the source electrode structure 20 is connected to a ground plane conductor 21 disposed on the back surface of the structure 10 through an electrically conductive via 23, as shown.

More particularly, the semiconductor structure 10 includes: a substrate 32 here for example, silicon (Si), silicon carbide (SiC), or silicon on insulator (SOI). A layer of a Group III-N semiconductor layer 34 on an upper portion of the substrate 32, here for example, gallium nitride (GaN) having a thickness of approximately ~1-5 microns over the upper surface of the substrate 32 followed by a second Group III-N semiconductor layer 36, here aluminum gallium nitride ($Al_xGa_{1-x}N$, where x is $0<x\le1$) for example having a thickness of approximately 5-30 nm, on the upper surface of the Group III-N layer 34. It should be understood that the layer 34 is here a GaN buffer structure, which also includes nucleation and strain relief layers, not shown; typically aluminum nitride (AlN) and aluminum gallium nitride ($Al_xGa_{1-x}N$, where x is $0<x\le1$). Conventional silicon (Si) foundry compatible, subtractive patterning (lithography and etching) techniques may be used to remove portion of the Group III-N semiconductor layer 34 and Group III-N semiconductor layer 36 to form a mesa structure; or, electrical isolation provided by an etched mesa structure could alternatively be provided by ion implantation (instead of etching), here for example nitrogen, thereby resulting in a planar structure.

Still more particularly, the gold-free gate electrode structure 14 includes: (a) a lower, T-shaped, electrode contact structure 14a in contact with the AlGaN layer 36, the lower, T-shaped, electrode contact structure 14a having a lower layer 14a' in contact with the AlGaN layer 36 and, an upper layer 14a"; and (b) and an upper, Damascene, electrical interconnect structure 14b, having a barrier/adhesion layer 21b1' and a copper layer 21b2, to be described in detail hereinafter. It also noted that the gold-free drain electrode structure 18 and the gold-free source electrode structure 20 are identical in construction and fabrication except that the source electrode structure 20 is connected to the ground plane conductor 21 disposed on the back surface of the structure 10 through the electrically conductive via 23, as described above. The gold-free drain electrode structure 18 and the gold-free source structure 20 each includes: (a) a lower electrode contact structure 21a in contact with the AlGaN layer 36 having, as shown more clearly in FIG. 3A having: (i) an Ohmic contact section $21_{OC}$; and (ii) an etch stop layer $21_{ES}$; and (iii) an upper, Damascene, electrical interconnect structure 21b having: (a) a barrier/adhesion layer 21b1; and (b) a copper layer 21b2, to be described in detail hereinafter. The gold-free gate electrode structure 14, gold-free drain electrode structure 18, and gold-free source electrode structure 20 are electrically isolated one from the other by dielectric layers 38, 44, 45, 47 and 49, in a manner to be described in detail hereinafter.

Figure 2A:
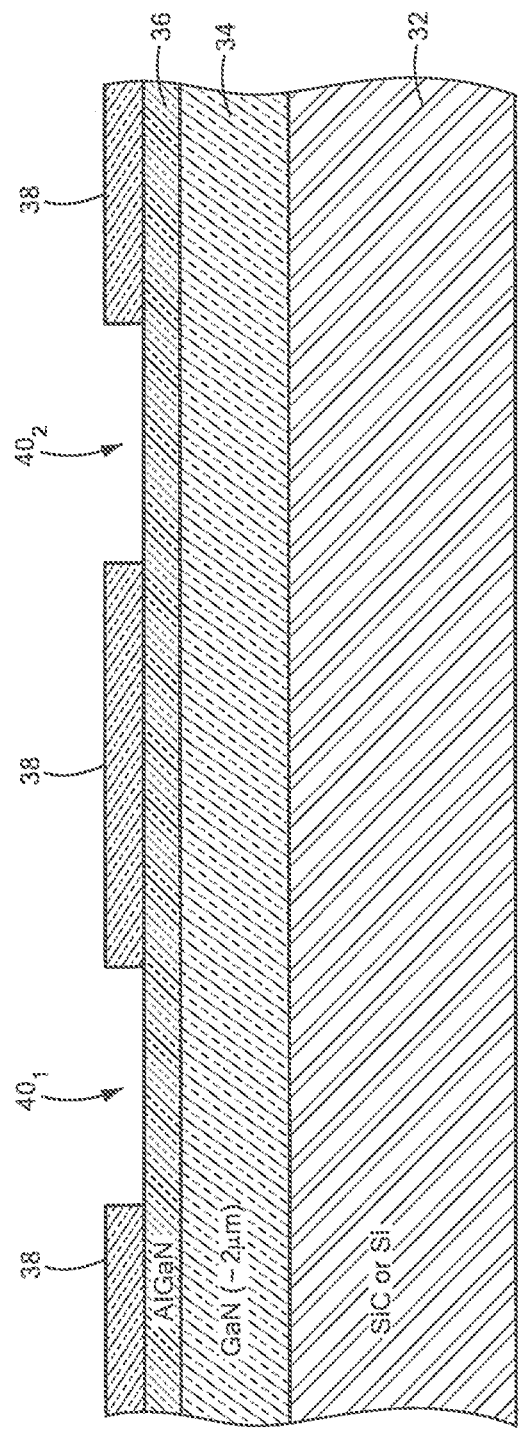
FIGS. 2A-2K are simplified, diagrammatical sketches of the semiconductor structure of FIG. 1 at various stages in the fabrication thereof.

Referring now to FIG. 2A, the structure having: the substrate 32; the Group III-N semiconductor layer 34 on an upper portion of the substrate 32; and the second Group III-N semiconductor layer 36 is provided and the upper surface of the second Group III-N semiconductor layer 36 is coated with a passivation layer 38, here for example, silicon nitride SiNs, and having a dielectric constant (relative permittivity) of 7. Layer 38 is processed using conventional silicon (Si) foundry compatible subtractive patterning (lithography and etching) techniques to form windows or openings $40_1$, $40_2$ through selected portions of layer 38 with windows 40 thereby exposing underlying surface portions of the AlGaN layer 36 where the lower electrical contact structures 21a are to be formed, as shown in FIG. 2B.

Figure 2B:
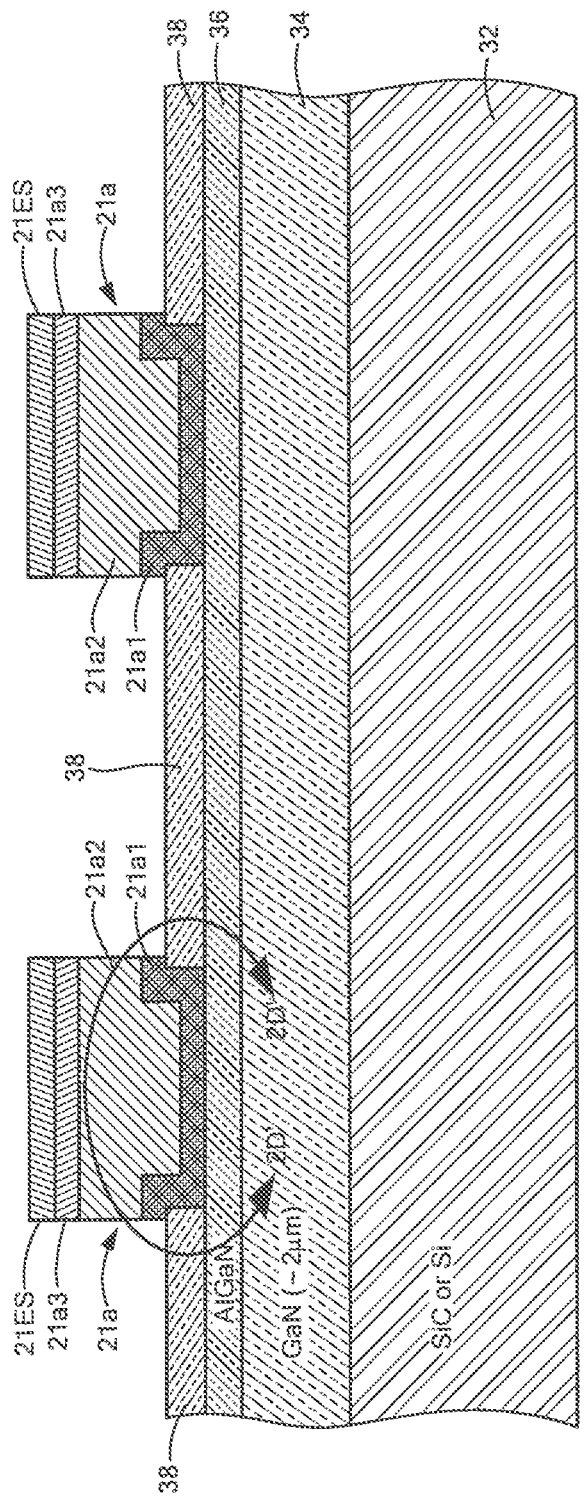

Referring now to FIG. 2B, drain and source electrode structures 18, 20, as previously discussed, are identical in construction, an exemplary one thereof being shown in more detail in FIG. 3A. Thus, the electrical contact structure 21a is shown to include, as noted above: (A) the gold-free Ohmic contact structure $21_{OC}$ having: the bottom layer 21a1 of titanium (Ti) or tantalum (Ta); a layer 21a2 for example, aluminum or Si doped aluminum ($Al_{1-x}Si_x$), where the Si doping, x, is typically ≤0.05) on the layer 18'a; and the layer 21a3, for example tantalum (Ta) or a metal nitride, here for example titanium nitride (TiN); (B) a gold-free, electrically conductive etch stop layer $21_{ES}$, here for example, tungsten, nickel, molybdenum, platinum or a metal nitride (such as TiN or TaN), disposed on the Ohmic contact structure $21_{OC}$; and, (C) the gold-free electrical interconnect structure 21b, here a copper Damascene electrode contact, to be described in connection with FIG. 2K; suffice is to say here that the electrical interconnect structure 21b includes the barrier layer 21b1, here for example Ta or TaN or a combination thereof, and the copper layer 21b2, as shown. It is noted that an etch stop layer $21_{ES}$ etches at a rate at less than one half (≤½) the rate to a particular etchant than the rate such etchant etches through material being etched prior to reaching the etch stop layer. The layers 21a1, 21a2, 21a3 and $21_{ES}$ are disposed over the surface of the structure shown in FIG. 2A and through the openings 40 in contact with the AlGaN layer 36. After deposition of the layers 21a1, 21a2, and 21a3, the Ohmic contact structures $21_{OC}$ are formed using conventional silicon (Si) foundry compatible subtractive patterning (lithography and etching) techniques (specifically the Ohmic contact structures $21_{OC}$ are dry etched using a chlorine-based dry etch chemistry). The electrical contact structures 21a are then formed in Ohmic contact with the Group III-N semiconductor layer 36, here the AlGaN layer during an anneal process to be described. A typical thickness for layer 21a1 and layer 21a3 is 5-30 nm, while the layer 21a2 can range from 50-350 nm depending on the metal layers chosen for the Ohmic contact three-layer structure $21_{OC}$ stack.

More particularly, in order to maintain optimum contact morphology and for contamination control, the anneal of the Ohmic contact structure $21_{OC}$ to form a semiconductor Ohmic contact is kept below the melting point of aluminum (≤660° C.). Such low temperature anneals typically take longer than five (≥5) minutes in a nitrogen ambient at a steady state temperature. A first metal element of the metal to semiconductor Ohmic contact structure $21_{OC}$, here for example Ti or Ta layer 21a1, is deposited directly on or disposed in contact with the Group III-N surface here for example $Al_xGa_{1-x}N$ layer 36 and forms a metal nitride by reacting with the Group V element nitrogen in the Group III-N material interface layer 36 during the temperature ramp from ambient temperature to a steady state anneal temperature during the Ohmic contact formation anneal (also herein referred to as Ohmic anneal) of the Ohmic contact structure $21_{OC}$. It is noted that the temperature ramp is typically ≤15° C./sec when a linear temperature ramp is used, however stepped temperature ramp profiles, and mixed step and linear ramp profiles all may be used in order to optimize first metal layer 21a1 interaction with the Group III-N surface layer 36 in the formation of the metal nitride. Next, a second lower resistance metal, here for example aluminum layer 21a2, diffuses into the first metal (here layer 21a1), the formed metal nitride, and into the surface of the Group III-N material (here layer 36) during the steady state anneal process of ≤660° C. for ≥5 minutes to provide the lowest resistance Ohmic contact. Finally, in order to maximize the amount of interaction between the first and second metals, here layers 21a1 and 21a2 of the metal to semiconductor Ohmic contact structure $21_{OC}$ that forms the Ohmic contact, and the Group III-N material layer 36 at ≤660° C. temperatures, it is necessary to prevent intermixing with any third metal layer (a metal nitride or metal, here layer 21a3) disposed above the two layers (here layers 21a1 and 21a2) and in contact with the upper layer of the two (here layer 21a2).

Figure 4B:
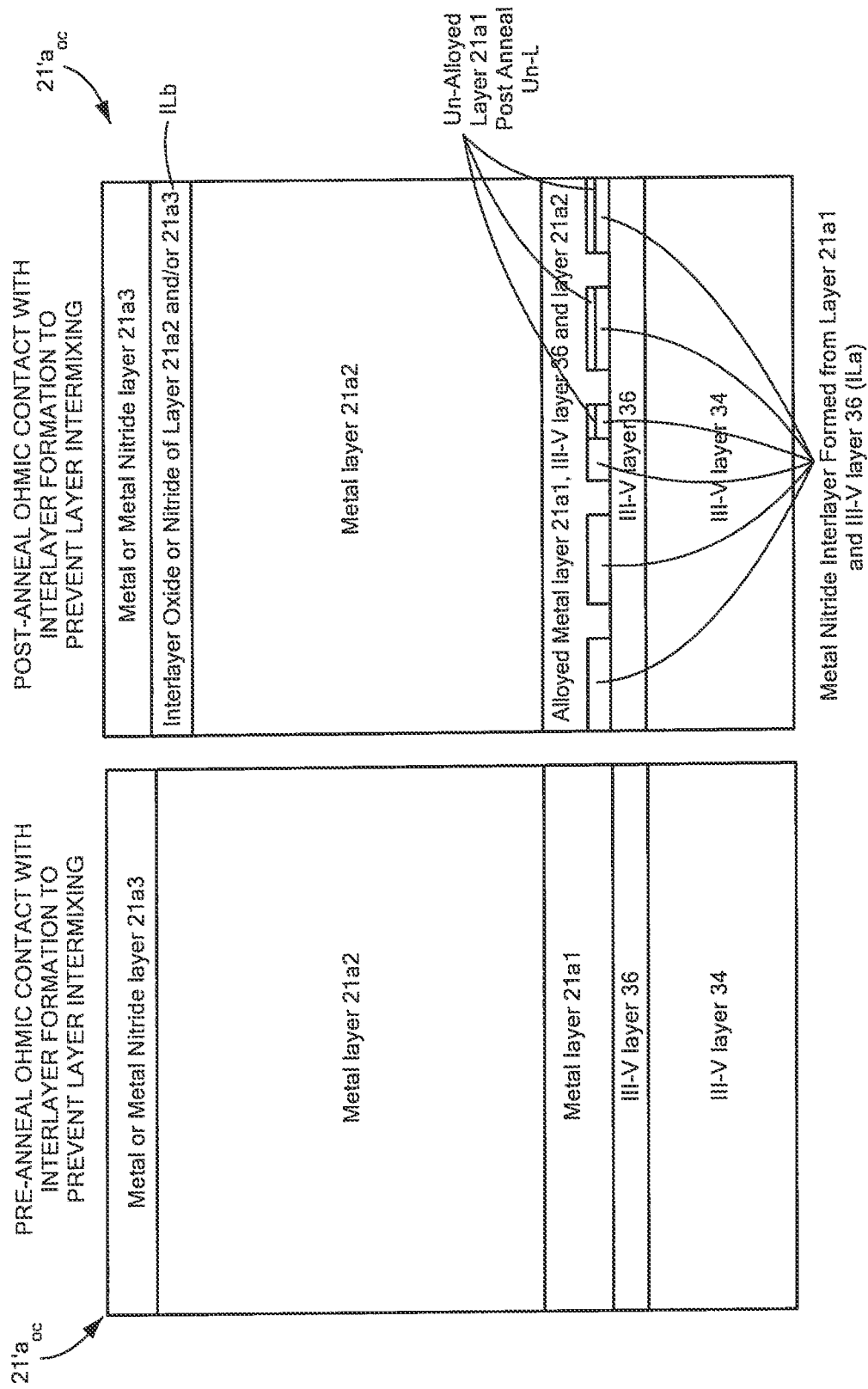
FIGS. 4B and 4B' is a pair of diagrammatical cross sectional sketches useful in understanding another low temperature anneal process used in forming the semiconductor structure according to the disclosure.

The prevention of intermixing of the first two layers of the Ohmic contact structure $21_{OC}$ (here layers 21a1 and 21a2 with the third (here layer 21a3) can be accomplished in several ways: First, it may be accomplished by depositing the Ohmic contact structure $21_a$ and annealing the Ohmic contact structure $21_a$ as a two-layer stack of the first and second metals (layers 21a1 and 21a2 with a subsequent removal of any oxidized interface (by dry etching, wet etching, or in-situ dry sputter removal of the oxidized interface) prior to third metal deposition (here layer 21a3); Second, when all three metals layers 21a1, 21a2 and 21a3 of the Ohmic contact structure $21_a$ are deposited prior to Ohmic anneal of the Ohmic contact structure $21_{OC}$, one of the following two methods may be used to form a low temperature (≤660° C.) Ohmic contact between the Ohmic contact structure $21_a$ and the Group III-N semiconductor layer 36: In the first method, and referring to FIG. 4A, a metal nitride layer (such as TiN, or TaN, here layer 21a3) of the Ohmic contact structure $21_a$ is disposed in contact with the second aluminum layer (21a2). Metal nitride layer 21a3 resists intermixing with layer 21a2 during the anneal at 5660° C., and metal layer 21a1 is alloyed with Group III-N layer 36 and metal layer 21a2 with a metal nitride Inter-Layer a, ILa, being formed interfacial reactions between layer 21a1 and Group III-N layer 36, as shown in FIG. 4A' (it is noted that there may be some Un-alloyed portions, Un-L of layer 21a1 after the anneal and that the metal nitride interlayer may be discontinuous) forming a post-anneal Ohmic contact structure $21_a$; In the second method, (and referring to FIG. 4B) a thin (~1-10 nm thick) partially oxidized second metal (here Aluminum layer 21a2) or third metal (here Ta, TiN, or TaN layer 21a3) or combination thereof, an Inter Layer, ILb, is formed by reaction with oxygen that is either present in the gases used in, or intentionally introduced into, the deposition and/or anneal apparatus during the Ohmic contact structure 21a deposition process or Ohmic anneal of the Ohmic contact structure 21a. This partially oxidized metal interlayer ILb is formed between the second metal layer (here aluminum layer 21a2) and the third metal or metal nitride layer (here Ta, TiN, or TaN layer 21a3) or in contact with the second aluminum layer (21a2) which resists intermixing during the anneal at ≤660° C. forming post anneal Ohmic contact structure $18_{OC}$, as shown in FIG. 4B'. To put it another way, in the second method (FIGS. 4B and 4B'), the third metal layer 21a3 (a metal nitride or metal) is prevented from intermixing with layer 21a2 during annealing by the formation of an oxide interlayer ILb during the metal deposition and/or the anneal process, and the oxide interlayer layer ILb is formed between layer 21a2 and layer 21a3, and metal layer 21a1 is alloyed with Group III-N Layer 36 and metal layer 21a2, and metal nitride interlayer ILa is formed due to interfacial reactions between layer 21a1 and Group III-N layer 36 (it is noted that there may be some un-alloyed portions Un-L of layer 21a1 after the anneal). Thus, in one embodiment (FIGS. 4B and 4B') the intermixing is prevented by forming a partially oxidized interlayer ILb between the second and third metals of the Ohmic contact structure 21a during the electrical contact structure metal deposition and/or Ohmic anneal process. In the first method (FIGS. 4A and 4A'), the intermixing is prevented by forming a metal or metal nitride layer as layer 21a3.

Further optimization of the metal to semiconductor Ohmic contact resistance may also be achieved by adding a small amount of Silicon dopant to the Ohmic contact structure as noted above. Silicon may be deposited by multiple methods such as electron beam deposition and sputtering. Silicon can be deposited as a separate layer within the Ohmic contact structure 21a (by sputtering of a Silicon sputtering target or by electron beam deposition) or by mixing Silicon into another layer by co-sputtering pure targets (here for example silicon and aluminum) or by sputtering a Si doped target (here for example Si doped aluminum $Al_{1-x}Si_x$ layer 21a2 where the Si doping, x, is typically ≤0.05).

Thus, the Ohmic contact formation anneal at the low temperature may be summarized as follows: forming a metal nitride layer IIa due to an interfacial reaction between the first metal layer 21a1 of the Ohmic contact structure 21a and the Group III-N layer 36 of the Ohmic contact structure 21a, the metal nitride layer IIa forms during the temperature ramping phase of an anneal process from ambient temperature to a steady state temperature; wherein a second metal of the electrical contact structure here layer 21a2 diffuses into the first metal and to an upper surface of the Group III-N semiconductor layer here layer 36 to reduce resistance of the Ohmic contact formed at the interface of Group III-N layer 36 and Ohmic contact structure 21a; and wherein the first metal layer 21a1, in contact with the Group III-N semiconductor layer 36, and the second metal of the Ohmic contact layer 21a2 are prevented from intermixing with a third metal (or metal nitride) of the Ohmic contact layer 21a3 during the Ohmic anneal process; and wherein the first metal and the second metal and third metal (metal nitride or metal) are maintained below their melting points during the Ohmic contact formation anneal process. The prevention of intermixing of the first two metals (layers 21a1 and 21a2) with the third metal (layer 21a3) indirectly enhances the interaction of the first two metals with the Group III-N interface at low temperatures, thereby facilitating lower contact resistance. After the anneal process described above the electrically conductive etch stop layer $21_{ES}$, here for example, nickel, molybdenum or platinum or titanium nitride (TiN) is disposed on layer 21a3, as shown in FIG. 2B and FIG. 3A.

Figure 2C:
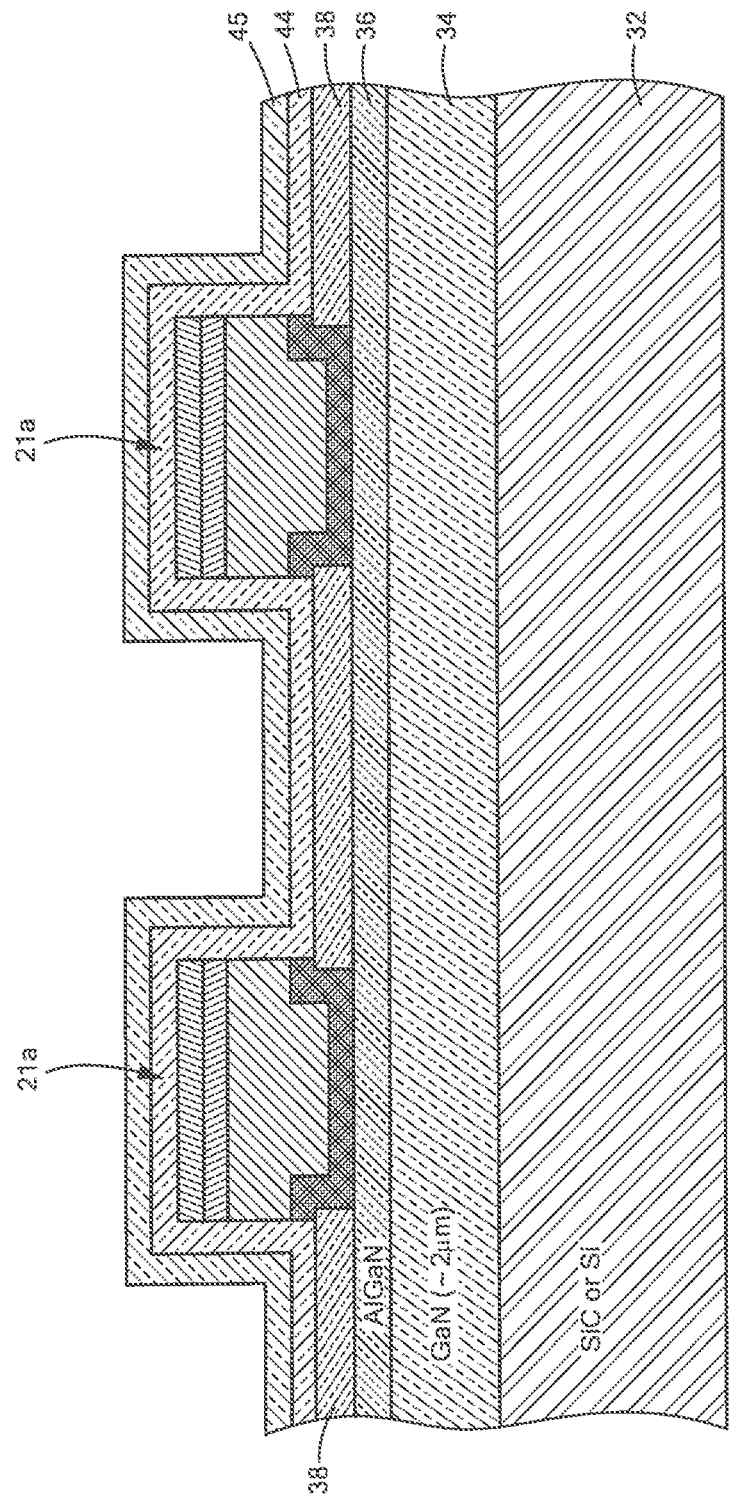

Referring now to FIG. 2C, the surface of the structure shown in FIG. 2B is coated with the dielectric layer 44, here also $SiN_x$, and having a dielectric constant (relative permittivity) of 7 and a typical thickness of 2-70 nm, followed by a layer 45 of low dielectric constant (low K), here for example $SiO_2$ as shown, having a dielectric constant (relative permittivity) of 3.9 and a typical thickness of 2-300 nm. The low dielectric constant layer 45 lowers the overall capacitance of the T-shaped gate electrode structure 14a to be described later. Lowering the overall capacitance of the T-shaped gate electrode structure improves the high frequency performance of the fabricated transistor structure.

Figure 2D:
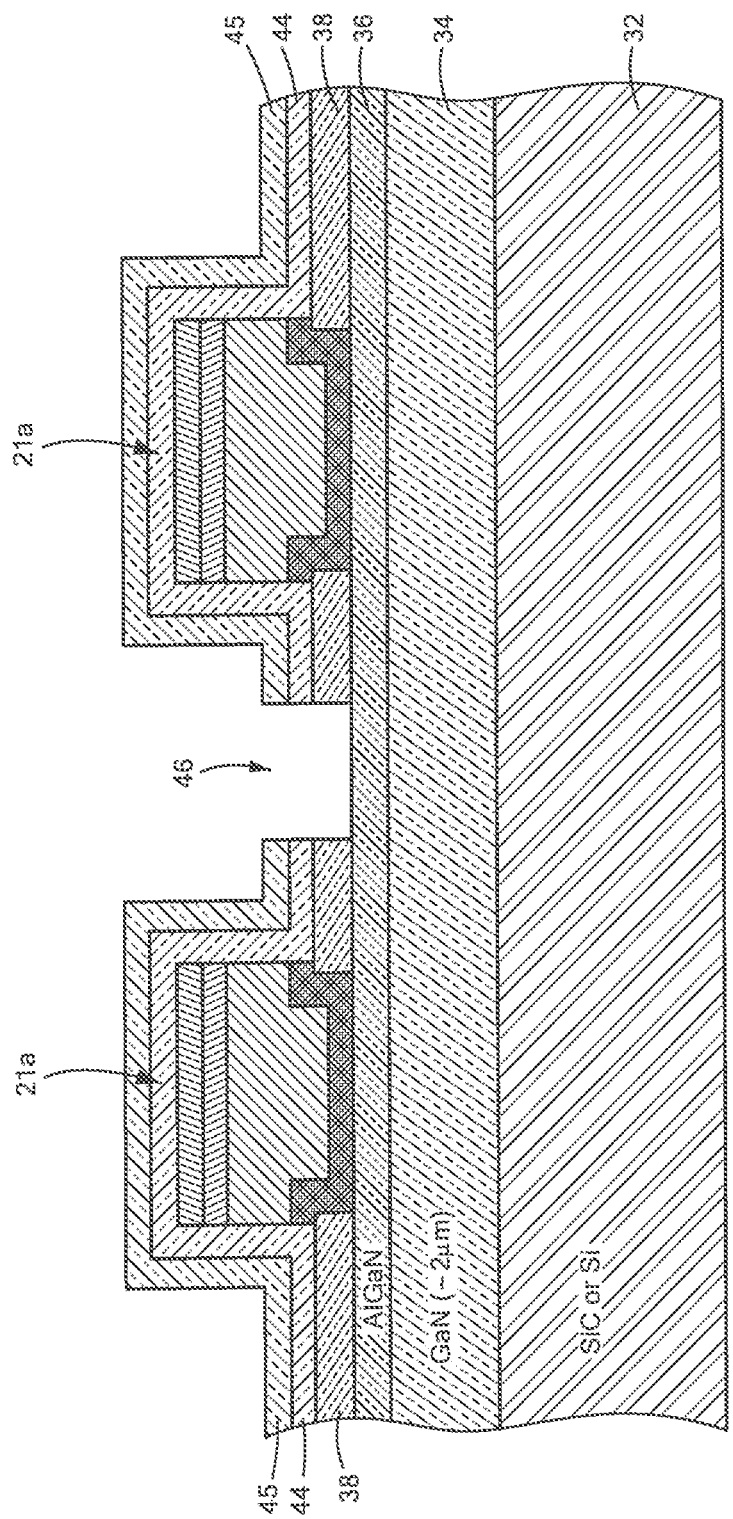

Referring now to FIG. 2D, opening or window 46 is formed through layers 38, 44, and 45, as shown using any conventional silicon (Si) foundry compatible lithography and etch processing techniques to expose portion of the Group III-N semiconductor layer 36 where the gate electrode structure 14 (FIG. 1) is to be formed, here in this embodiment, in Schottky contact with the Group III-N semiconductor layer 36, here the AlGaN layer. It is noted that the width of the window 46 at its interface with Group III-N semiconductor layer 36 determines the gate length (Lg) of the transistor. The gate length (Lg) of transistors typically using the T-gate topology described herein is, (but not limited to, gate lengths of 0.5 m.

Figure 2E:
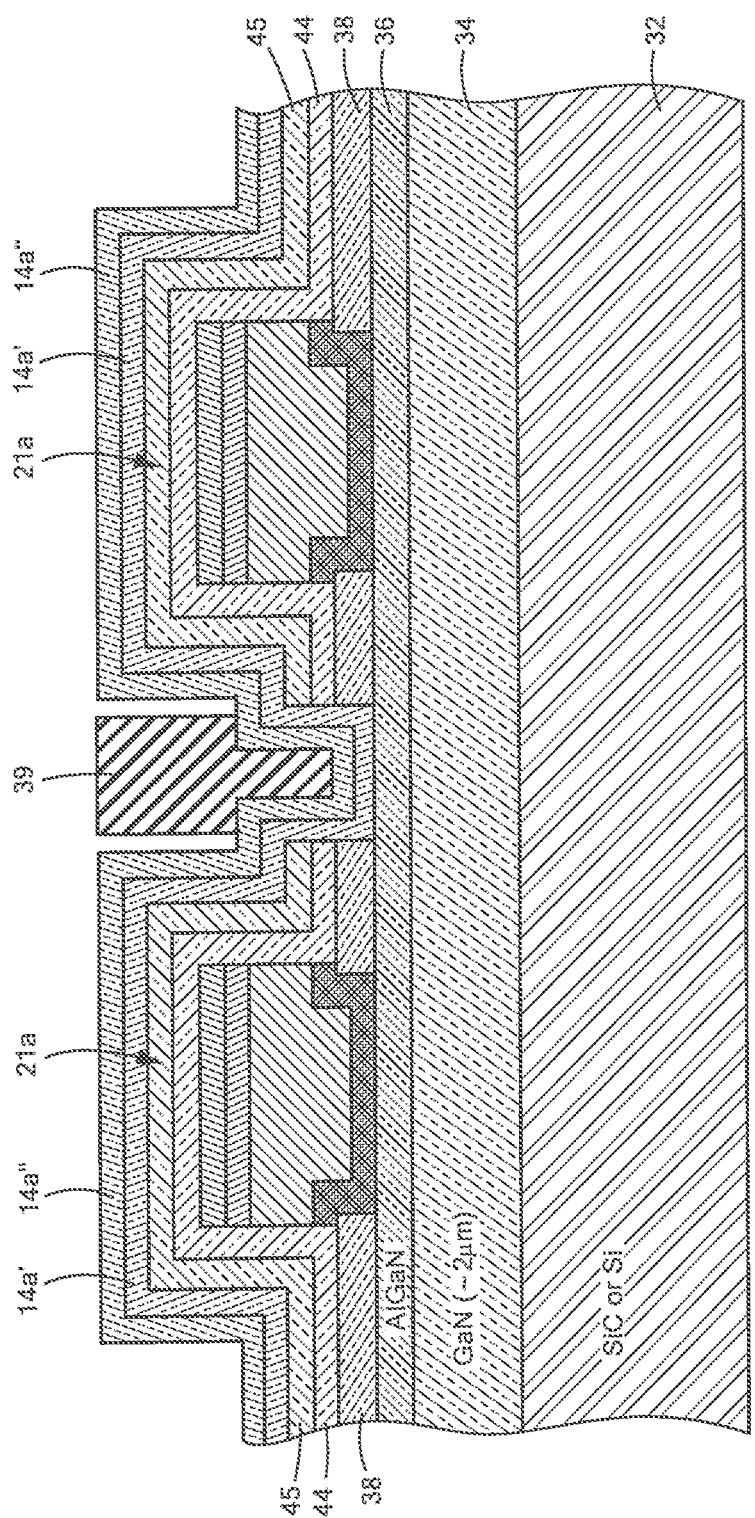
Figure 2F:
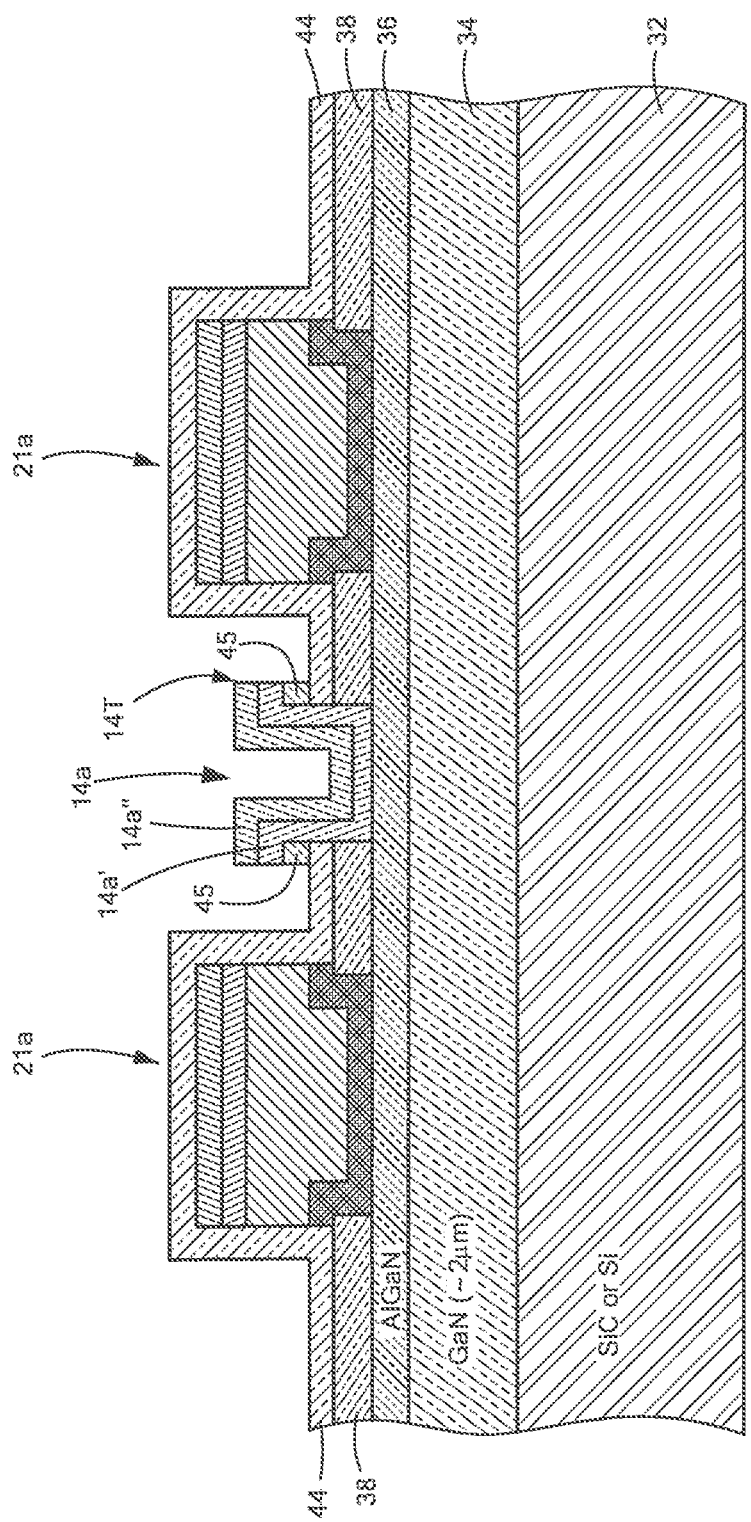

Referring now to FIGS. 2E and 2F, a process to form the gate electrode contact structure 14a (FIG. 1) will be described. More particularly, the gate electrode contact structure 14a (FIG. 1) is formed through the opening or window 46 (FIG. 2D) using silicon (Si) foundry compatible lithography and etch processes, as shown. As shown in FIG. 2E, a layer 14a' of nickel (Ni) is deposited over the structure shown in FIG. 2D and through the window 46 (FIG. 2D) onto the portion of the surface of the AlGaN layer 36 exposed by the window 46 followed by a layer 14a" of Tantalum (Ta) or Tantalum Nitride (TaN) or combination thereof over the deposited layer 14a'. A photoresist mask 39 is deposited over the surface of the structure and patterned, as shown in FIG. 2E, over the portion of the layers 14a' and 14a" being used to form the gate electrode contact structure 14, as shown in FIG. 2F. Using the photoresist mask 39, the deposited layers 14a' and 14a" are patterned as shown in FIG. 2F using conventional silicon (Si) foundry compatible subtractive patterning (lithography and etching) dry, wet, or combination dry/wet etching techniques to form the T-shaped gate electrode contact structure 14a, as shown. As Ni is hard to dry etch in a silicon foundry the preferred method is here, for example, dry etching of Ta or TaN or combination thereof is followed by wet etching of Ni. It is noted that the stem portion of the T-shaped gate electrode contact structure 14a passes through the layers 38, 44 and 45 and the top portion of the T-shaped gate electrode contact structure 14a, more particularly, layer 14a', is disposed on portions of layer 45, as shown in FIG. 2F. Here, layer 14a' is 5-50 nm in thickness and layer 14a" is 5-100 nm in thickness. It is noted that prior to stripping away the photoresist mask 39 (FIG. 2E) used to pattern the T-shaped gate electrode contact structure 14, the underlying portions of the low K dielectric layer 45 are etched from the regions outside of the area protected by the resist using here for example, a fluorine base dry etchant, leaving only the low-K dielectric regions 45 located under horizontal upper or top portion, 14T, of the T-gate 14, as shown in FIG. 2F. Alternately, other materials may be used for low k dielectric region 45, such as benzocyclobutene (BCB with a relative dielectric constant of 2.6-2.65), or SiCOH (with a relative dielectric constant of 2.0-2.8), for example.

Figure 2G:
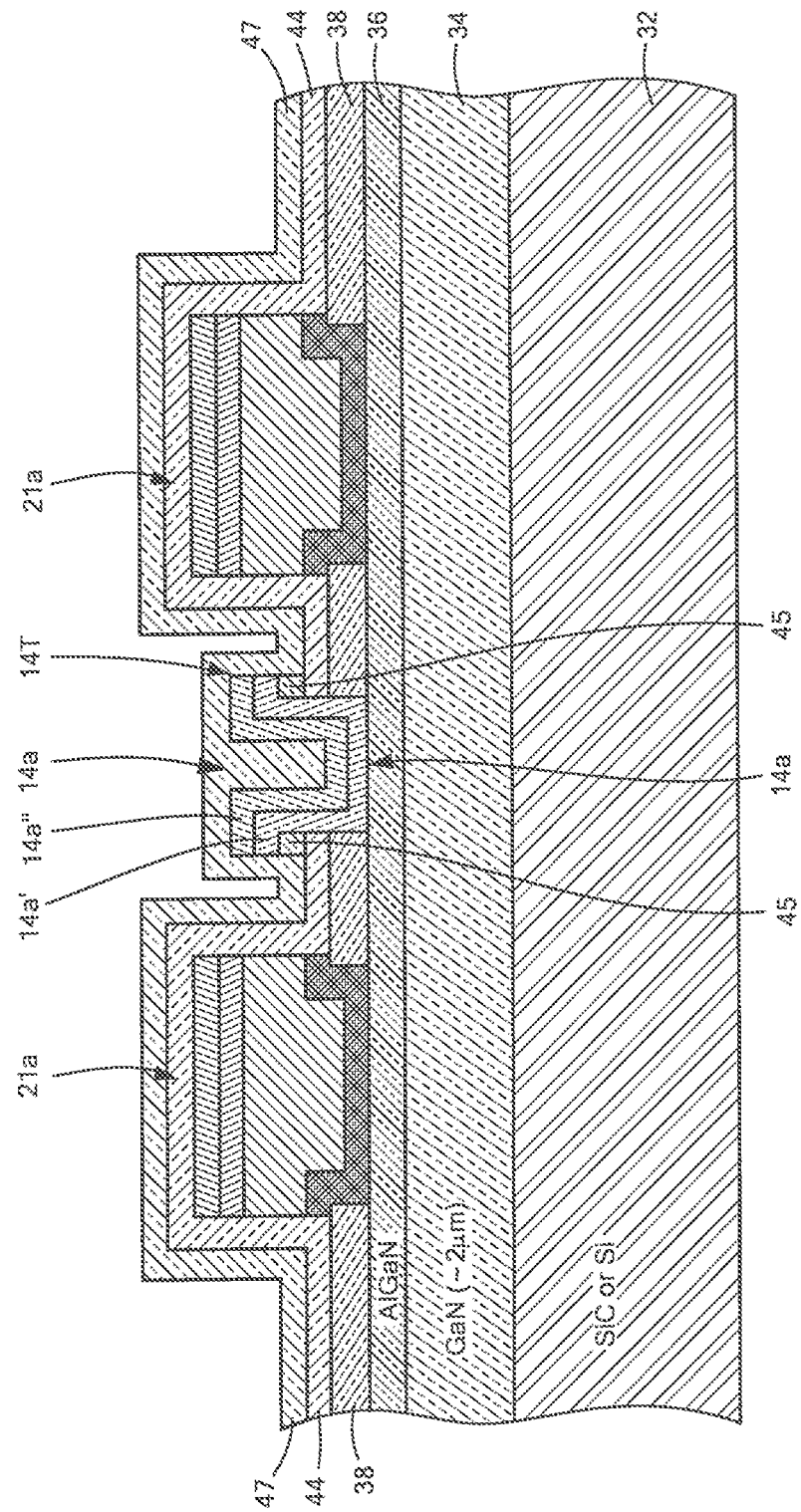
Figure 2H:
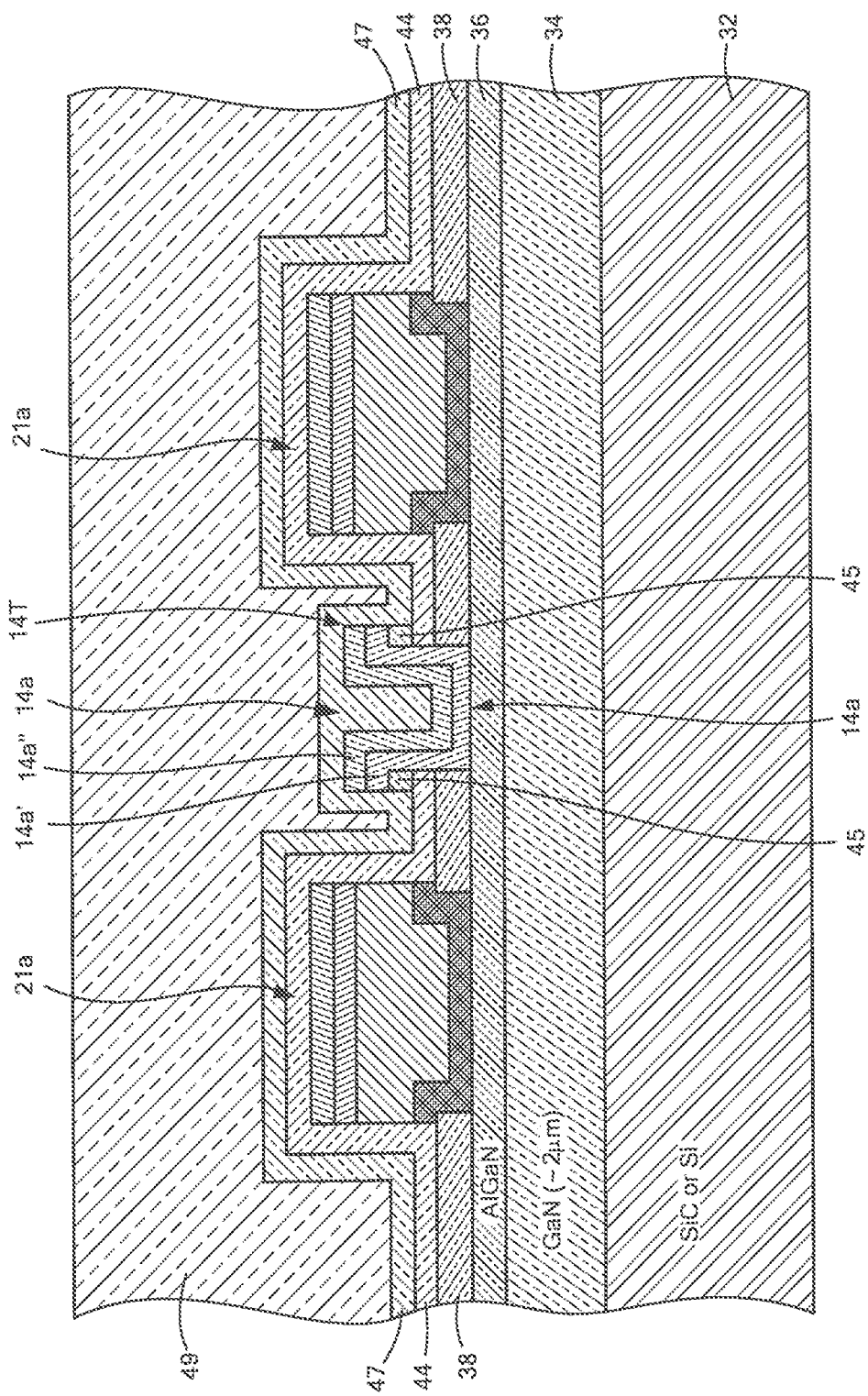
Figure 2I:
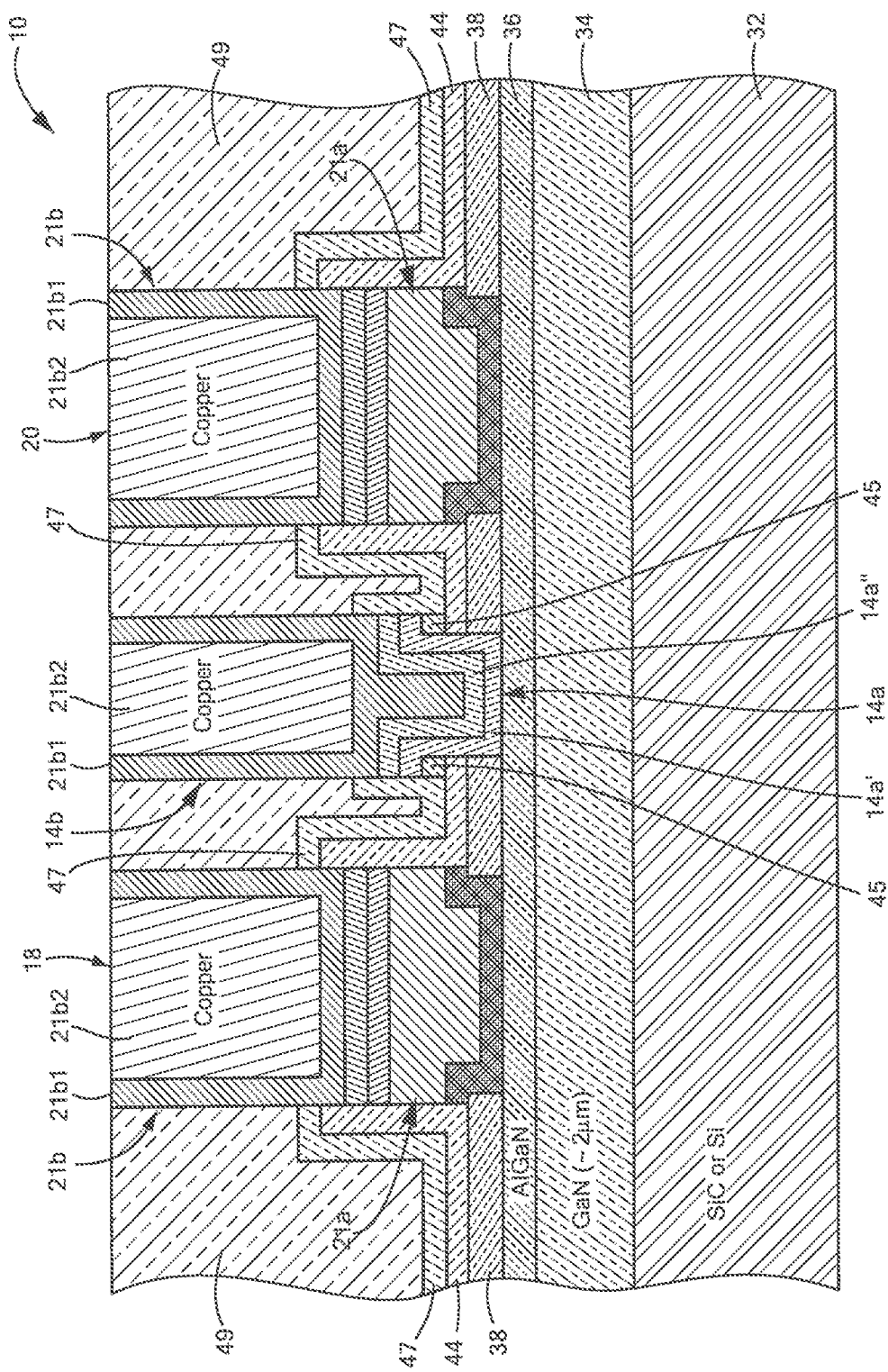

After electrode contact structure 14a formation, processing continues with the formation of the aforementioned electrode contacts, here the copper Damascene electrical interconnects 14b and 21b, as shown in FIG. 1. It is noted that the formation of each copper Damascene electrical interconnects 14b and 21b, occurs with the deposition of two dielectric layers (here $SiN_x$ layer 47 and $SiO_2$ layer 49) as shown in FIG. 2G and FIG. 2H respectively. The first layer 47, here $SiN_x$, functions as an etch stop. The second layer, here $SiO_2$ layer 49, is etched selectively to the first layer 47, here $SiN_x$, which is then etched to reveal the gate electrode contact structure 14a, the drain electrode contact structure 21a and the source electrode contact structure 21a thereby forming the trenches into which the copper Damascene electrical interconnects 14b and 21b is subsequently deposited, as shown in FIG. 2I.

More particularly, and referring to FIG. 3A, copper Damascene electrical interconnects 21b for source and drain electrode structure 18 and 20 will be described; it being recognized that Damascene electrical interconnect 14b for gate electrode 14 is formed in like manner and at the same time as the copper Damascene electrical interconnects 21b. Thus, Damascene electrical interconnects 21b (14b) are formed by first sputtering a thin metal seed layer 21b1 (typically Ta/Cu, Ta/TaN/Cu, or TaN/Cu and ≤100 nm) to facilitate copper 21b2 plating into trenches as shown. It is noted that the Ta, Ta/TaN, or TaN portion of the seed layer also functions as a copper diffusion barrier and as an adhesion layer to the dielectric. The excess copper overfill of the trenches is then removed with chemical mechanical polishing (CMP), which defines the metal interconnects by leaving only metal disposed in the trenches behind. As other copper Damascene layers are added, this process repeats as will be discussed below. Thus, the Damascene electrical interconnects 21b, 14b have co-planar upper surfaces. It is noted that in FET structures that do not require a source or drain electrode connected to a ground plane conductor on the bottom of the structure, the etch stop layer $21_{ES}$ is not required and therefore the gold-free source electrode structure 18, 20 is as shown in FIG. 3A'.

Figure 2J:
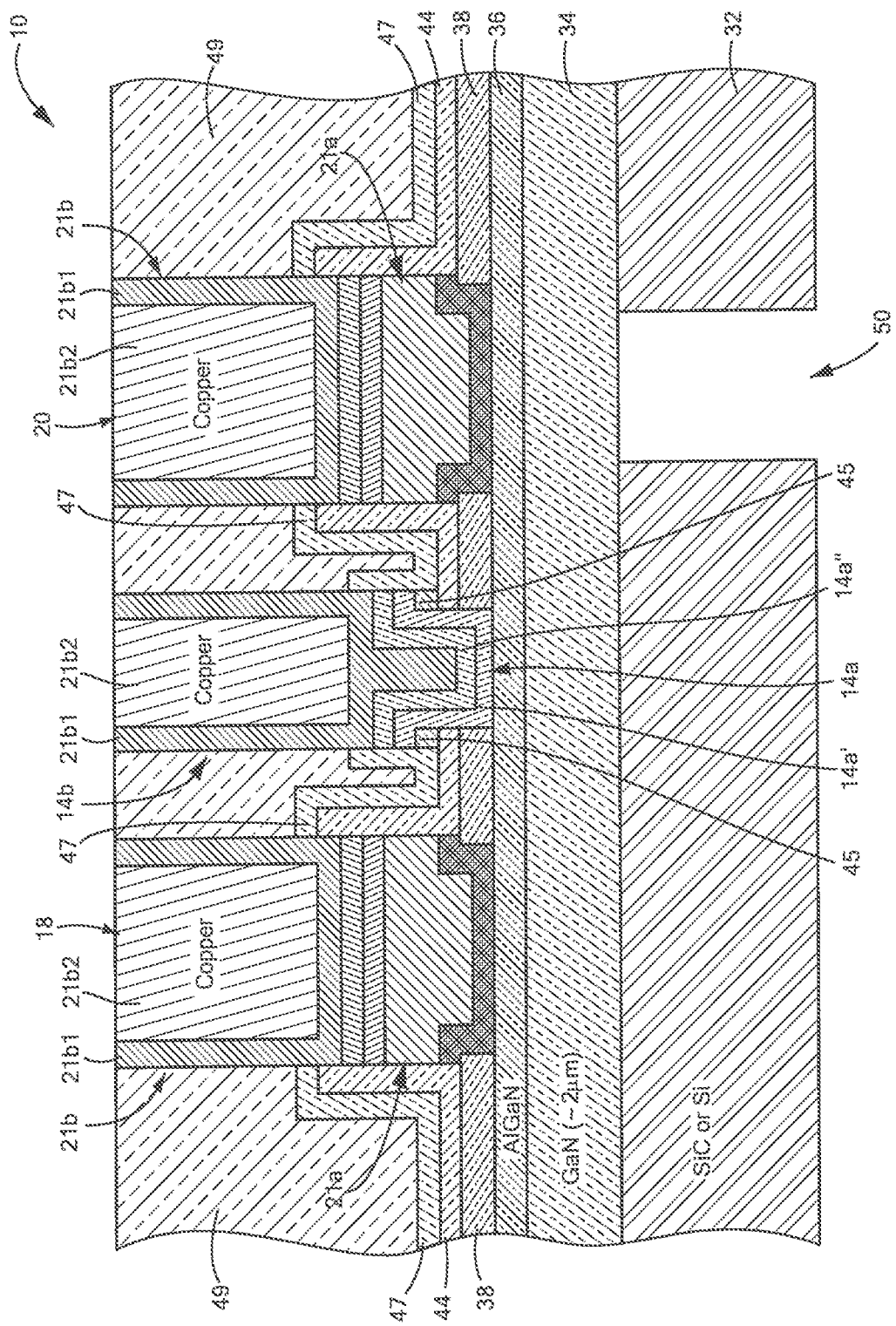

After completion of front-side processing, and referring now to FIG. 2J, the back-side processing begins. More particularly the wafer is mounted face down on a temporary carrier, not shown, the wafer is then thinned, here for example to 50 or 100 microns. The exposed bottom surface of such structure is masked to expose portions of the bottom of the substrate 32 under the source electrode 20. Next, a via hole 50 is formed in the exposed portions by etching from the bottom of the SiC or Si substrate 32 using a dry fluorine-based etch, here, for example sulfur hexafluoride ($SF_6$), FIG. 2I.

Figure 2K:
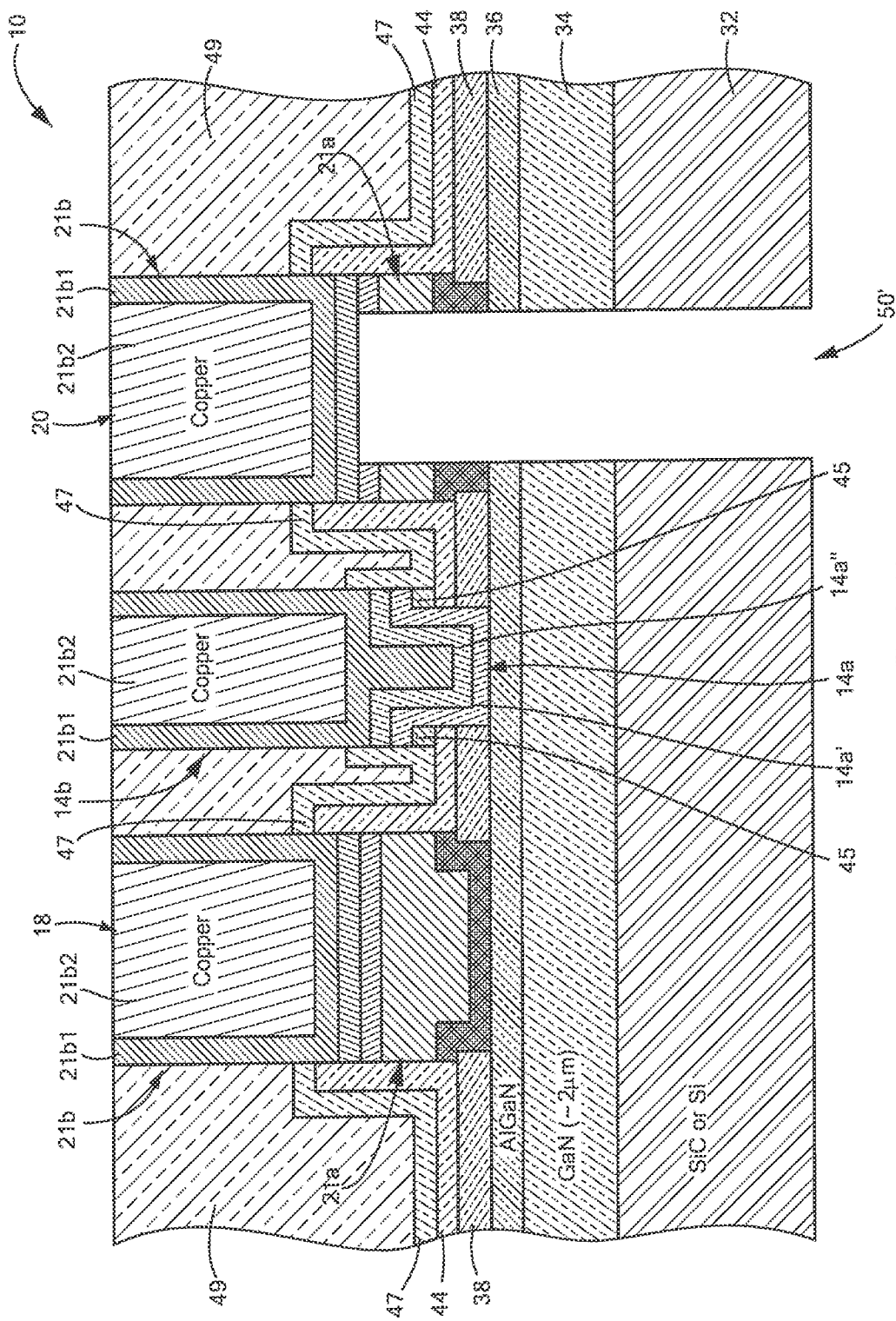
Figure 2F:
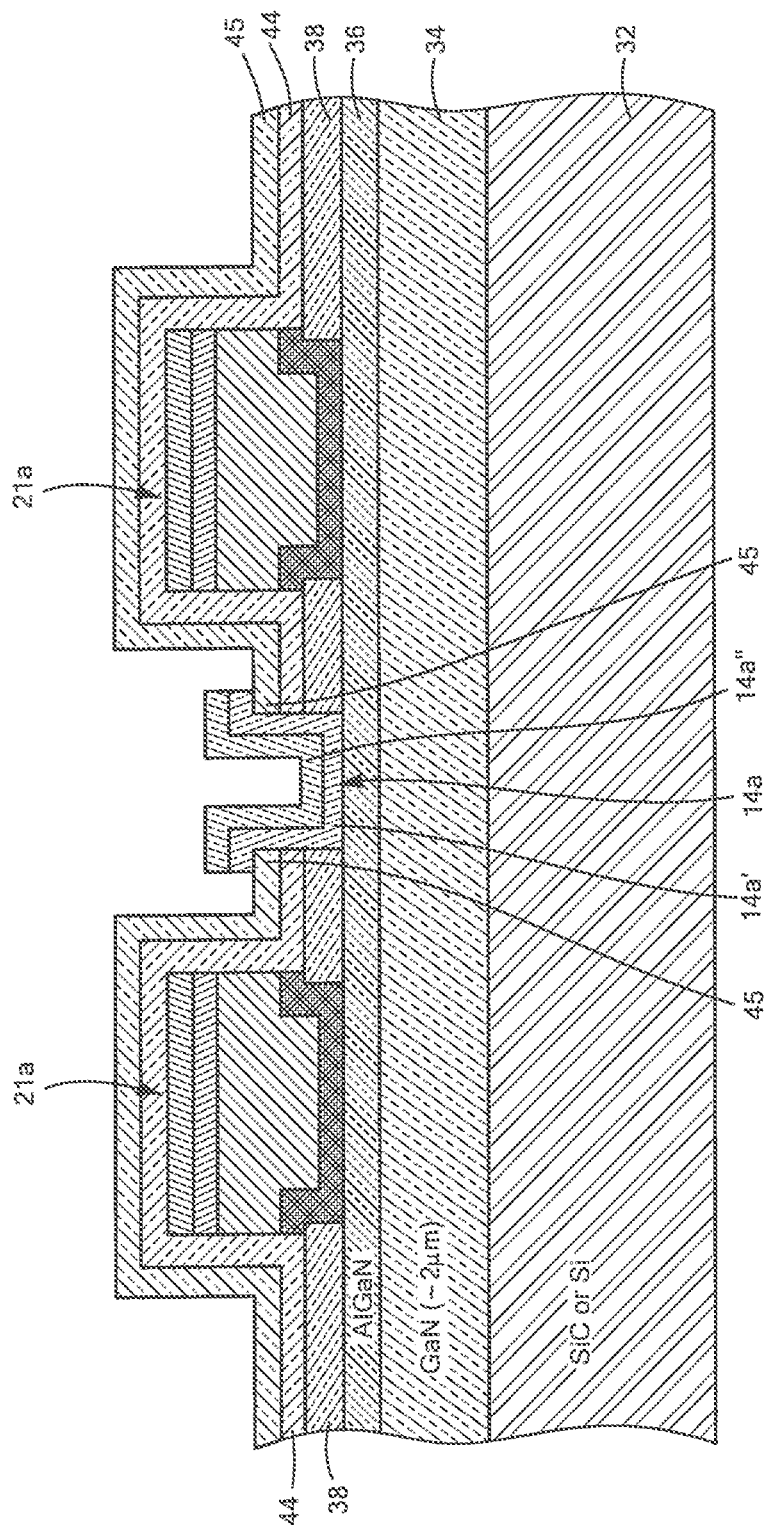
Figure 2G:
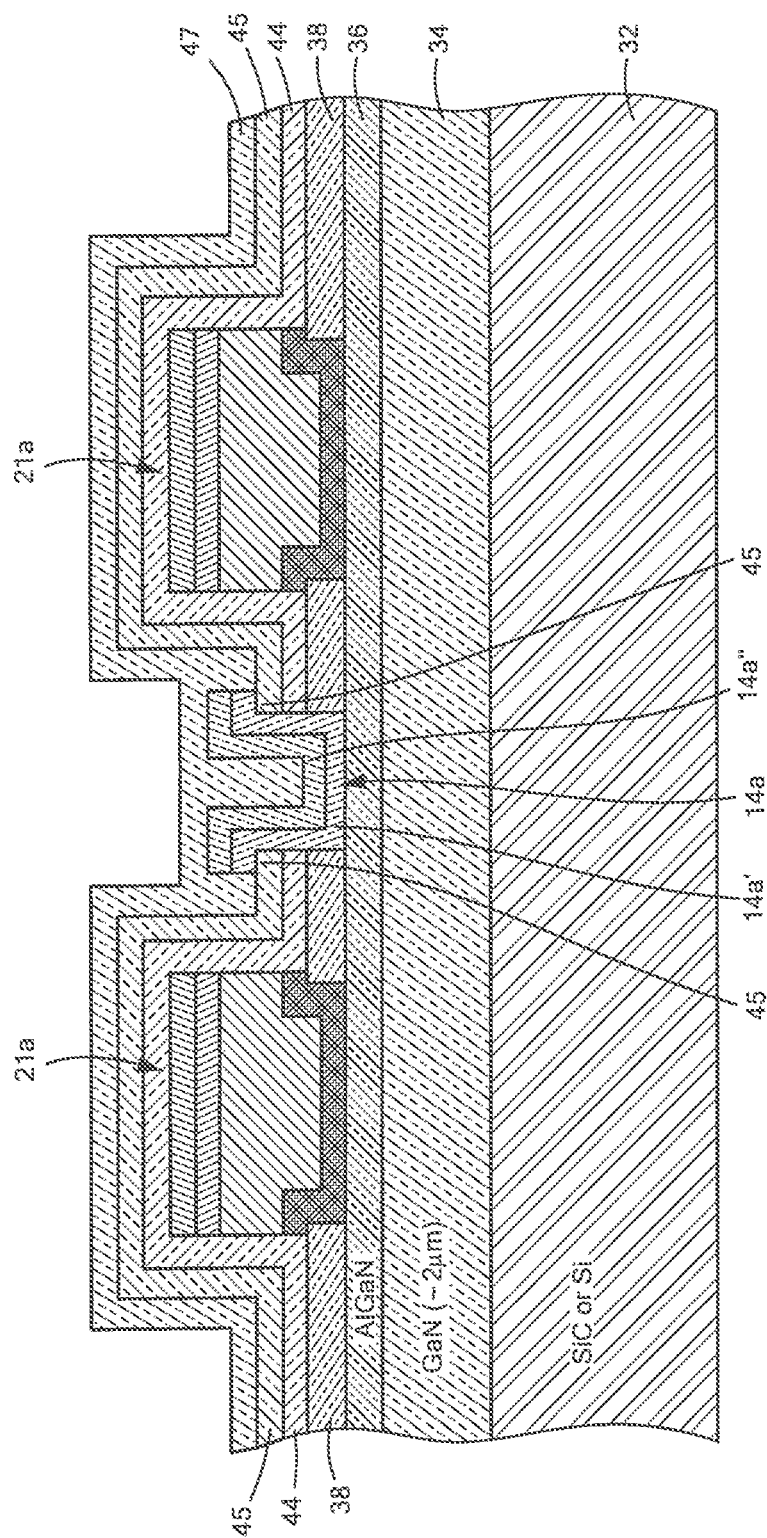
Figure 2H:
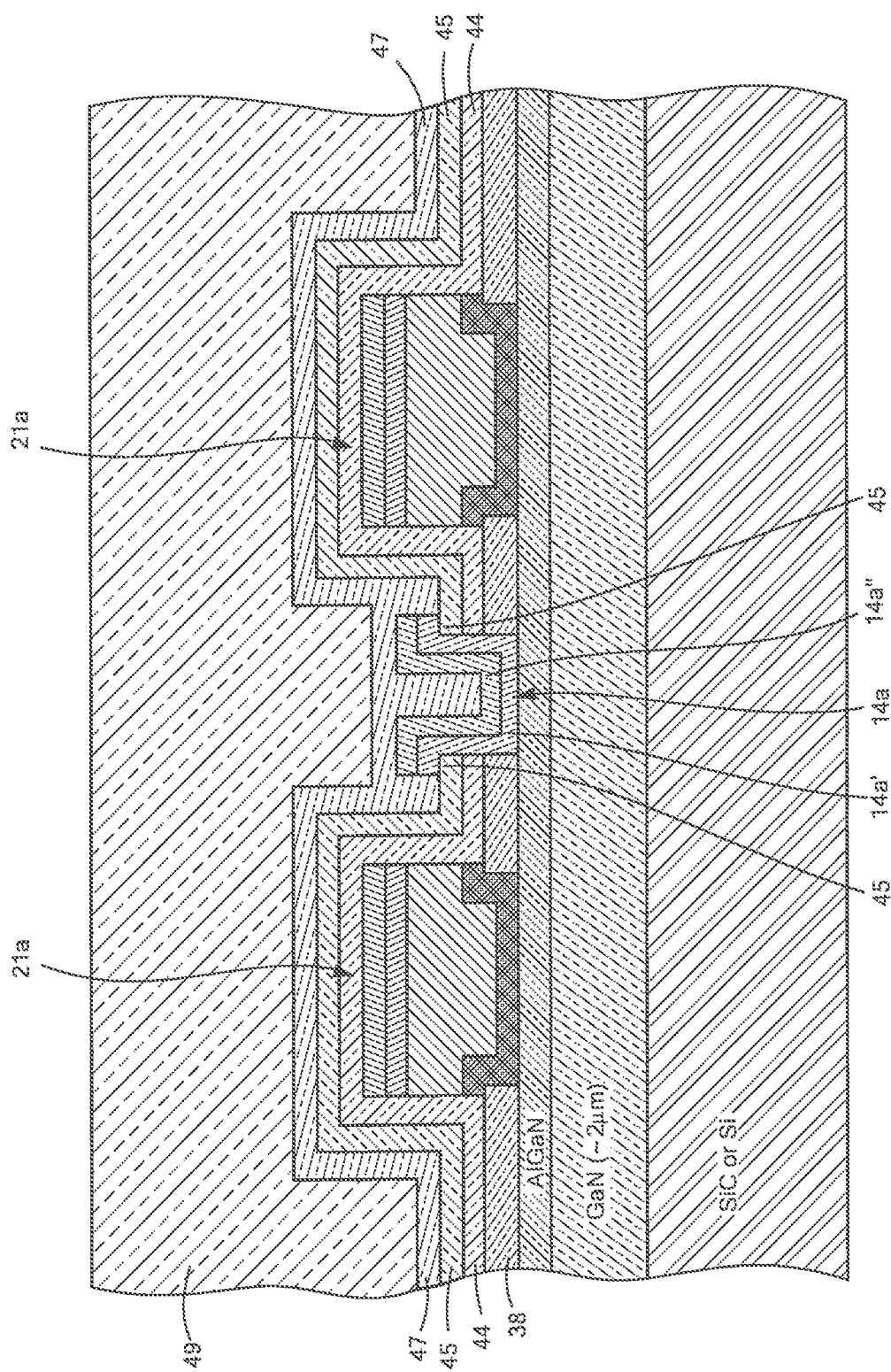
Figure 21I:
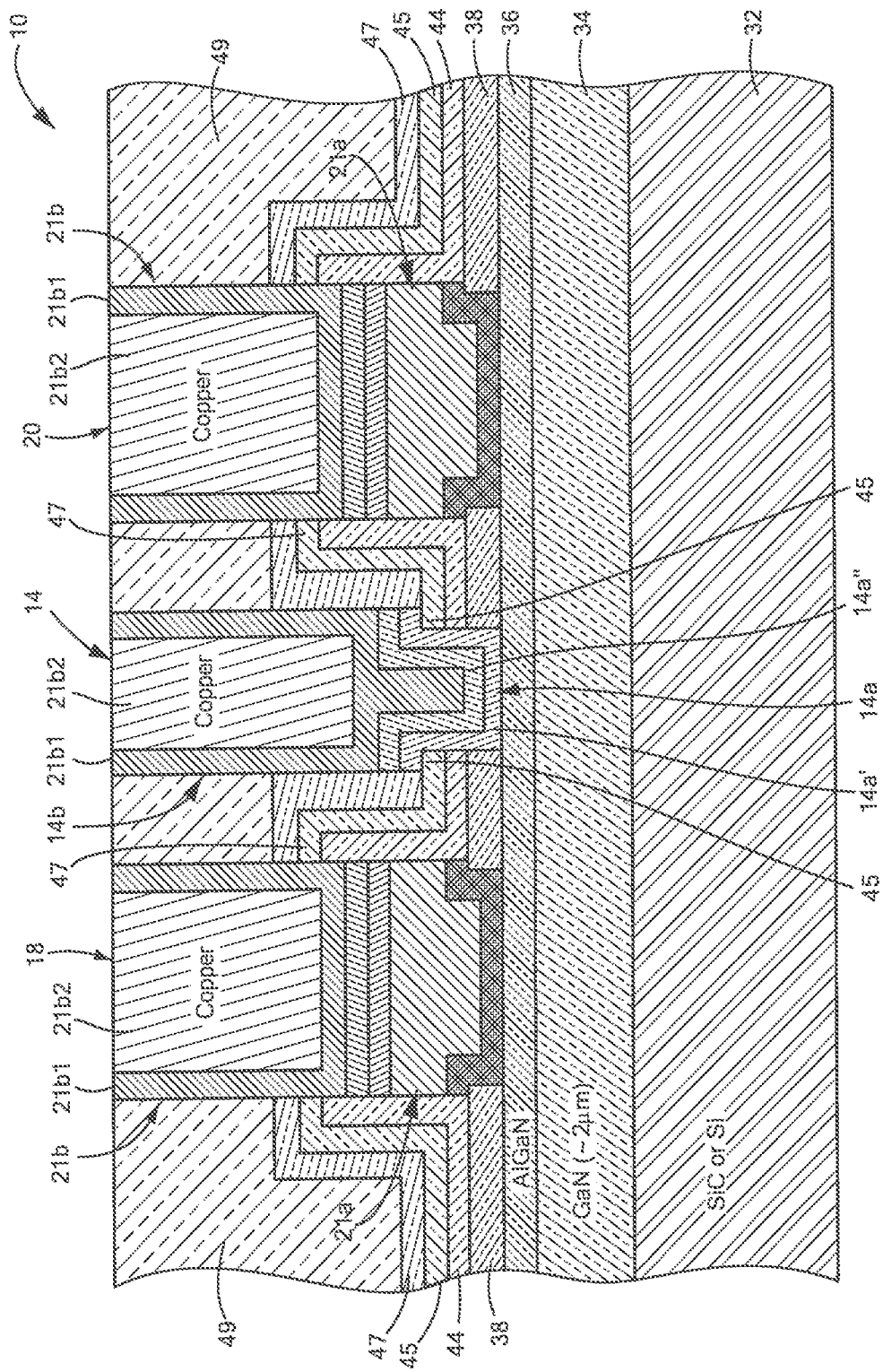
Figure 2J:
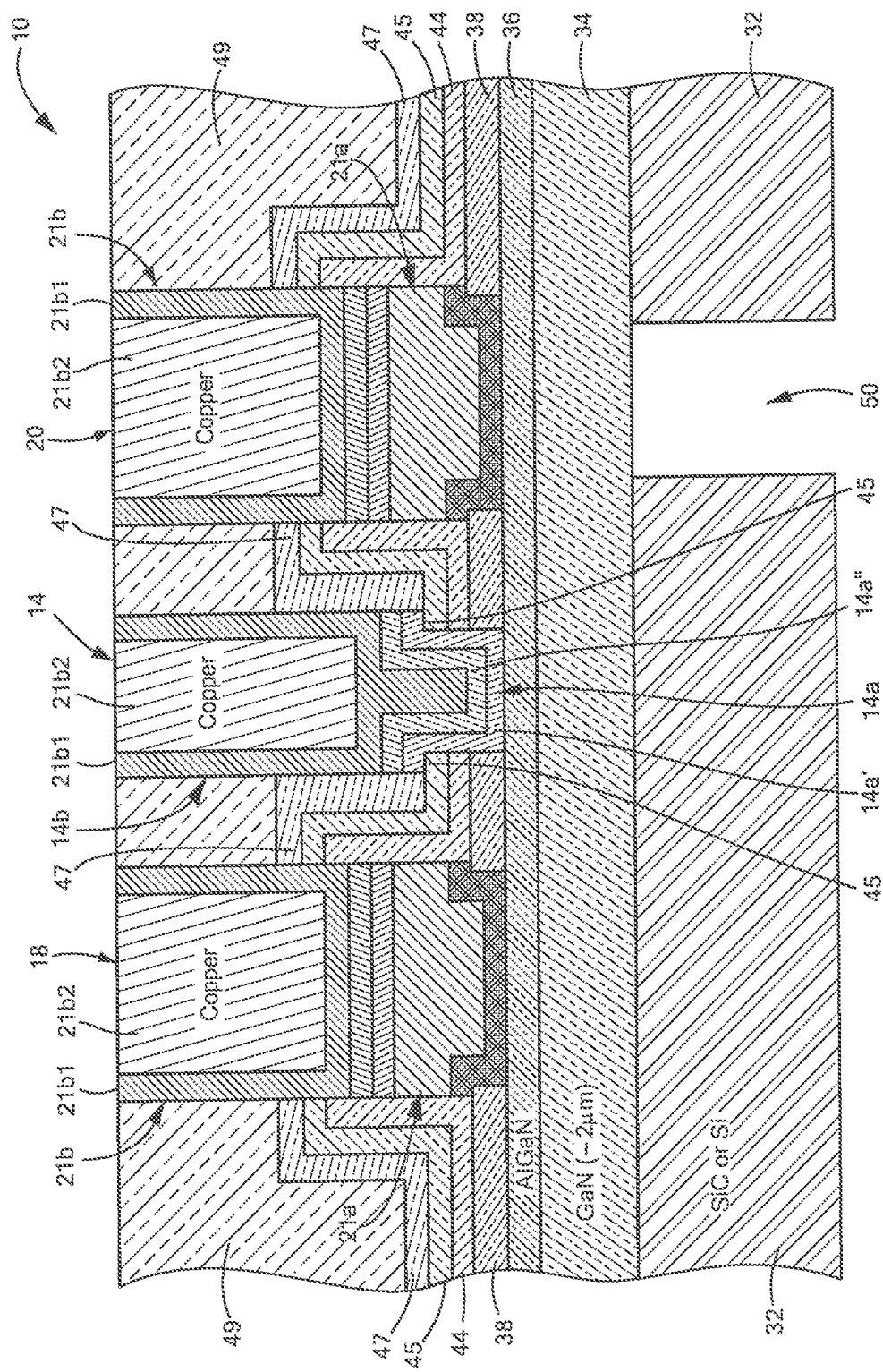
Figure 2K:
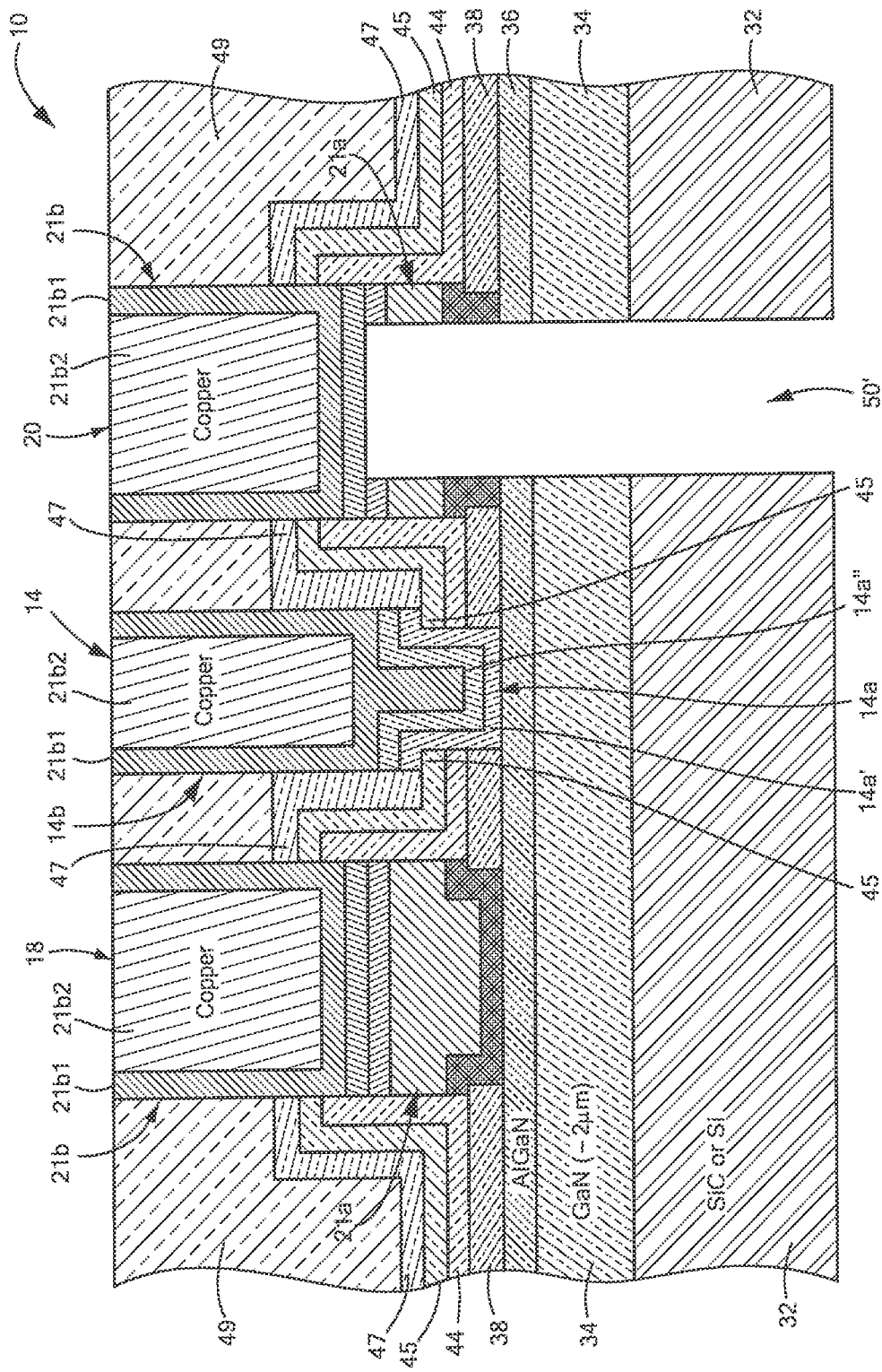
Figure 2L:
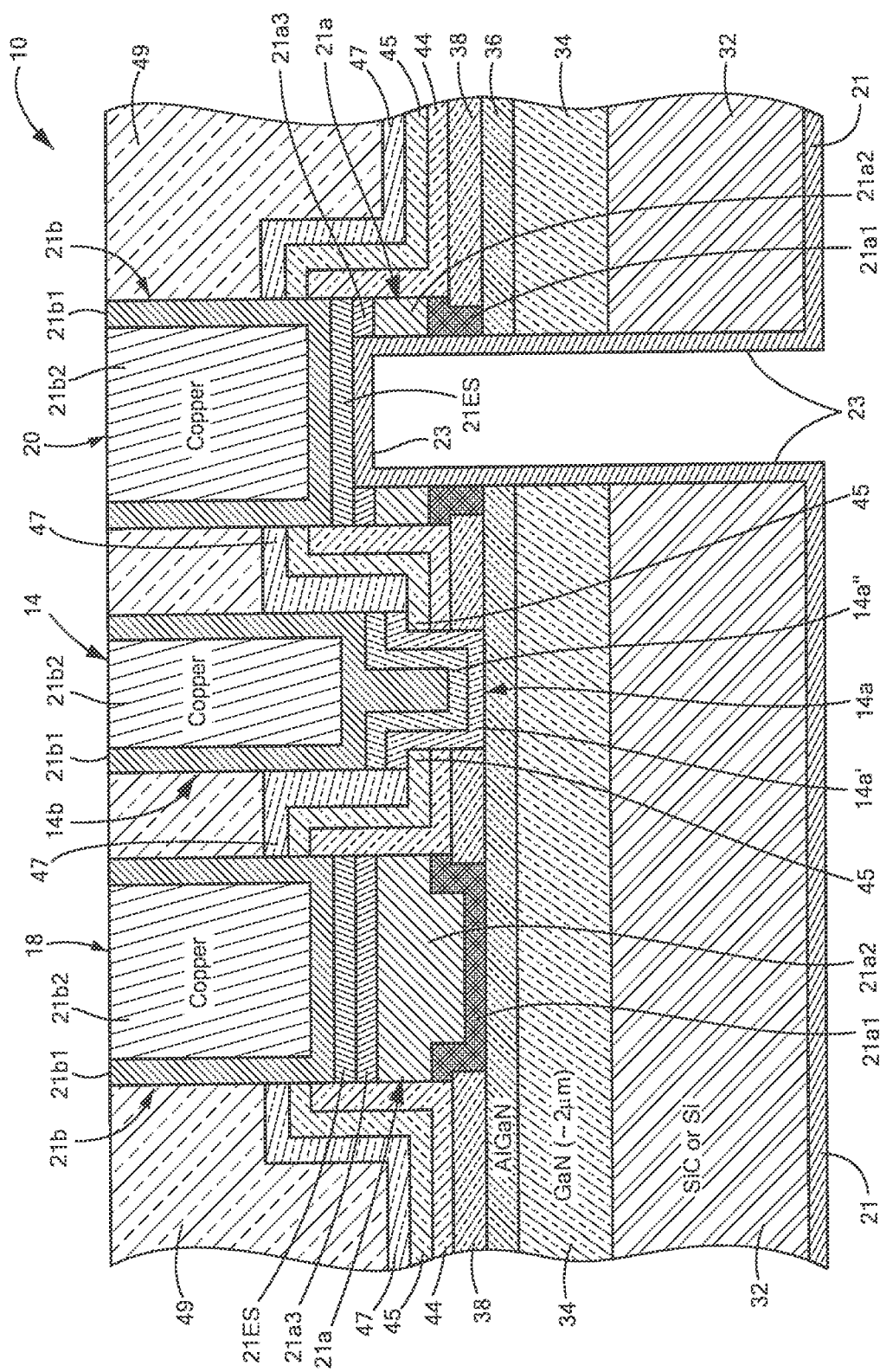
Figure 2F:
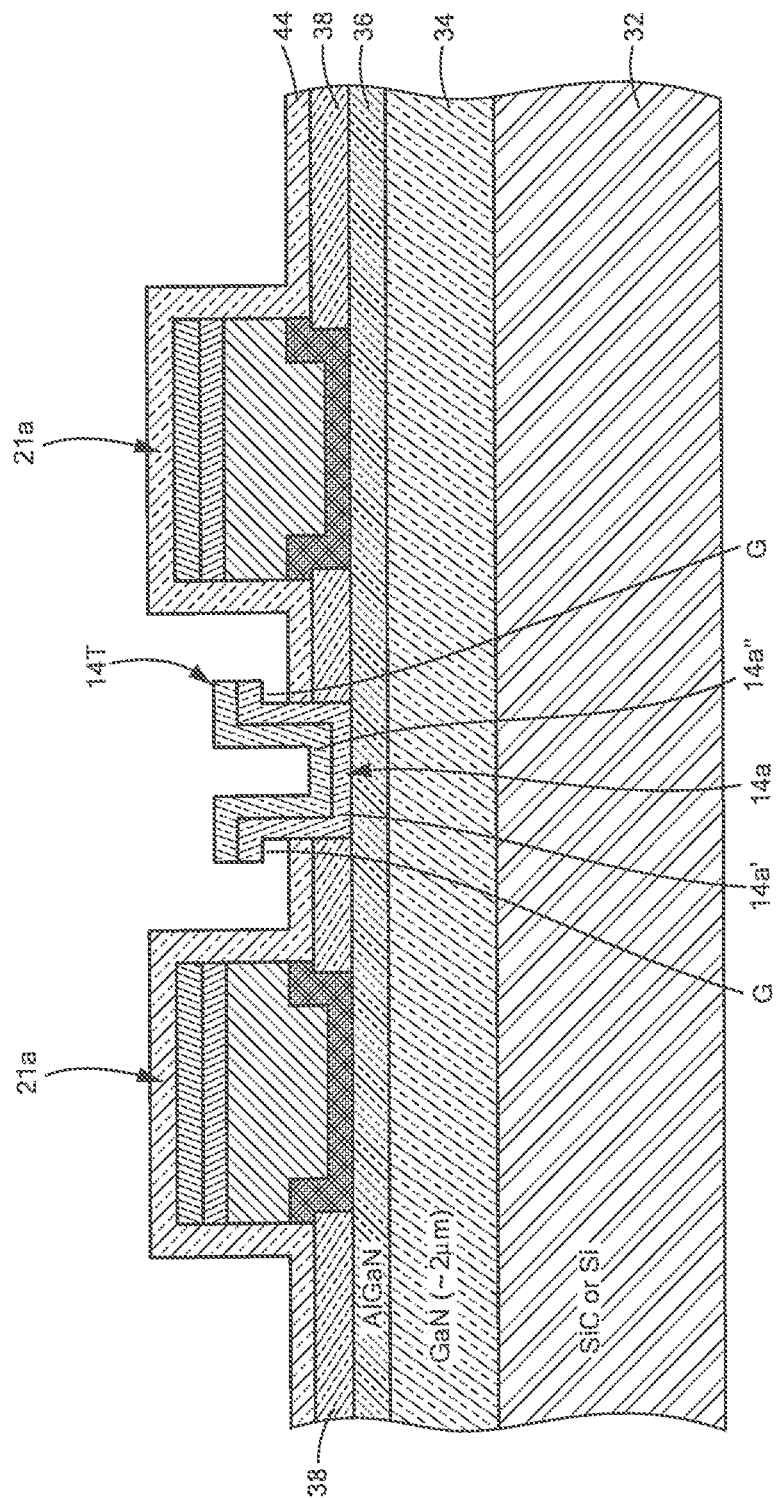
Figure 2G:
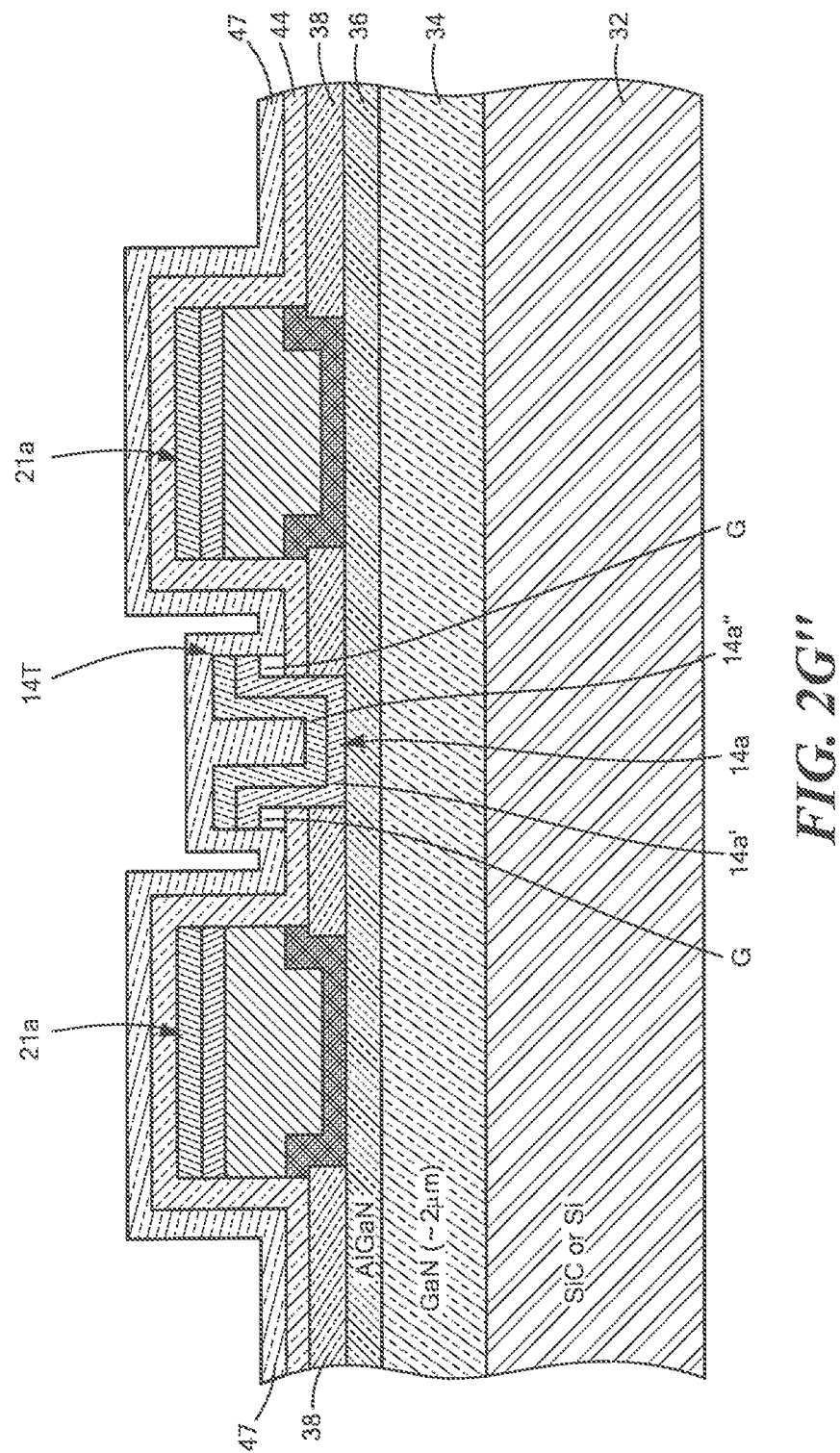
Figure 2H:
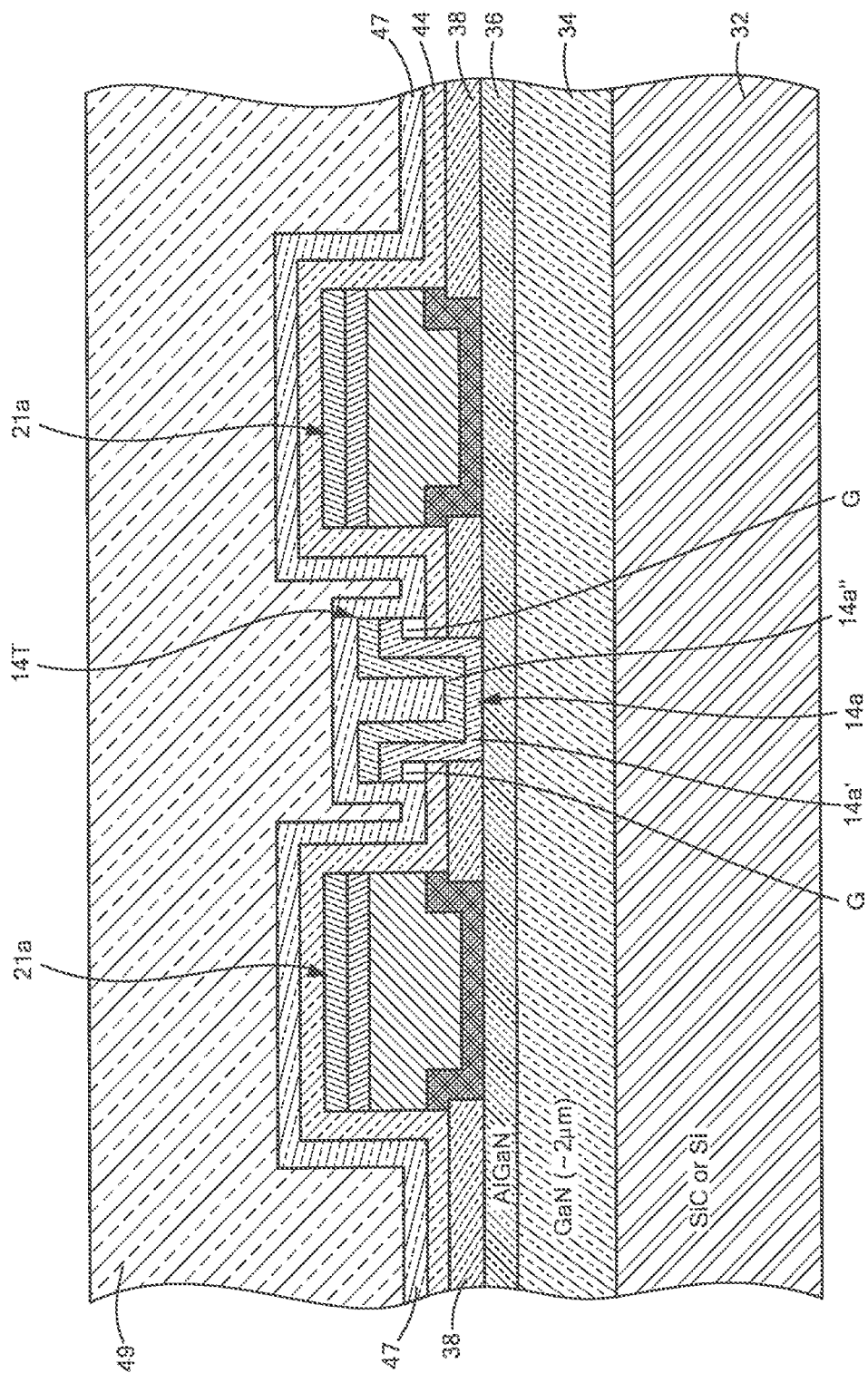

Referring now to FIG. 2K, the bottom surface of substrate 32 is exposed to a dry chlorine-based etch, here for example a combination of boron tri-chloride ($BCl_3$) and chlorine ($Cl_2$), to continue the depth of via hole 50 to thereby form via hole 50' by etching through the exposed portions of the Group III-N layer 34 and then through exposed inner portions of the Ti or Ta layer 22a1 then through inner portions of the aluminum-based layer 21a2, then through exposed inner portions of the metal nitride layer 21a3 of the Ohmic contact structures $21_a$ of the source contact 20; the etching then stopping at the etch stop layer $21_{ES}$ on the source electrical contact structure (FIG. 3A) under the source electrode contacts 20, as indicated. Next, referring also to FIG. 1, the bottom of the structure of has the ground plane conductor 21 and electrically conductive via 23 disposed on the bottom of substrate 32 and into via hole 50'. Here, for example, the ground plane conductor 21 and electrically conductive via 23 comprises an adhesion layer of Tantalum or Tantalum Nitride (or combination thereof) and a copper seed layer, and a thick plated copper layer. It is noted that during the formation of ground plane conductor 21 the process may be altered such that after the formation of the adhesion layer of Tantalum or Tantalum Nitride (or combination thereof) and a copper seed layer and a Nickel diffusion barrier layer are sequentially added, so that the wafer may be removed from gold-free fabrication area and then plated with a thick gold layer to thereby form the ground plane conductor 21.

Having described one embodiment, in another embodiment, and referring now to FIGS. 2F' through 2L', after forming the structure shown and described above in connection with FIG. 2E, the mask 39 (FIG. 2E) is used to etch layers 14a' and 14a" and the low dielectric layer 45 outside of the region covered by the mask 39; however, the portion of layer 45 outside of the mask 39 is not etched away but rather is left un-etched, as shown in FIG. 2F'. Interlayer dielectric and copper damascene structures are then formed as described previously as shown in FIGS. 2G'-2L'. Backside via processing progresses as described previously.

In yet another embodiment, and referring to FIGS. 2F" through 2H'", after completing the structure shown and described in FIG. 2F, the portion of layer 45 remaining under the top of the T-gate 14a is removed using a wet etch process; here for example a hydrofluoric acid, or dry etch process; here for example a fluorine based etch process, may be used that removes the low-K dielectric regions 45 located under horizontal upper or top portion, 14T, of the T-gate 14 (shown in FIG. 2F), in order to leave an airgap G as shown in FIG. 2F". Next, the layers 47 and 49 are applied resulting in the structure shown in FIG. 2G" and airgap G becomes remains free of solid material and thereby has a relative dielectric constant of 1. The process then continues as described above in connection with FIGS. 2IH-2K. Alternatively, a material that later degrades upon heating, such as for example, a copolymer of butylnorbornene and triethoxysilyl norbornene, can be used in order to leave an air gap G either before or after the next dielectric deposition.

A number of embodiments of the disclosure have been described. Nevertheless, it will be understood that various modifications may be made without departing from the spirit and scope of the disclosure. For example, the T-shaped electrode contact structure 14a may have alternative materials such as TiN for layer 14a' and W, Ta, TaN or combination thereof for layer 14a". In the case that this combination of materials is used for T-shaped electrode contact structure 14a a dry etch process will be used to form the finished contact; here for example a chlorine or fluorine based etch or combination thereof. Also for example the lower dielectric constant of the dielectric layer 45 may be comprised of a combination of the lower dielectric constant materials such as benzocyclobutene (BCB with a relative dielectric constant of 2.6-2.65), or SiCOH (with a relative dielectric constant of 2.0-2.8). Finally the higher K dielectric passivation layer 36 may be comprised other dielectrics such as Al2O3 (with a relative dielectric constant of ~9). Accordingly, other embodiments are within the scope of the following claims.

What is claimed is:

1. A semiconductor structure, comprising:
   a Group III-N semiconductor;
   a first dielectric disposed in direct contact with the Group III-N semiconductor;
   a second dielectric disposed over the first dielectric, the first dielectric having a higher dielectric constant that the second dielectric;
   a third dielectric disposed above the first dielectric, such third dielectric being in contact with the second dielectric; and
   a gate electrode contact structure comprising:
      a lower, vertically extending stem portion, sidewalls of the stem portion passing through, and in contact with, a portion of the first dielectric, a portion of the second dielectric, a bottom of the stem portion being in contact with the Group III-N semiconductor; and
      an upper, horizontal portion disposed on a top portion of the lower, vertically extending stem portion, a portion of the upper, horizontal portion extending horizontally beyond the lower, vertically extending stem portion, wherein the portion of the upper, horizontal portion extending horizontally beyond the lower, vertically extending stem portion is disposed over both a portion of the second dielectric and a portion of the first dielectric disposed under the second dielectric, wherein the upper, horizontal portion terminates at the third dielectric, and wherein the third dielectric has vertical sidewalls terminating at the edge of the horizontally extending portions of the gate electrode in contact with a vertical sidewall of the second dielectric and a vertical sidewall of the stem of the gate electrode.

2. The semiconductor structure recited in claim 1 wherein the gate electrode contact comprises Ni.

3. The semiconductor structure recited in claim 1 wherein the gate electrode contact comprises Ni/Ta, Ni/TaN, or Ni/Ta/TaN.

4. The semiconductor structure recited in claim 3 where a copper damascene interconnect structure is disposed above the gate electrode contact.

5. The semiconductor structure recited in claim 1 wherein the gate electrode contact comprises TiN.

6. The semiconductor structure recited in claim 1 wherein the gate electrode contact comprises TiN and W or Ta or TaN or a combination thereof.

7. The semiconductor structure recited in claim 1 where the second dielectric and third dielectric materials are comprised of different materials.

8. The semiconductor structure recited in claim 1 where the second dielectric and third dielectric are comprised of the same material.

9. The semiconductor structure recited in claim 1 where the second dielectric material has a relative dielectric constant of 1.

10. The semiconductor structure recited in claim 1 wherein the first dielectric comprises silicon nitride and the second dielectric comprises silicon dioxide.

11. The semiconductor structure recited in claim 1 where the first dielectric comprises silicon nitride, the second dielectric comprises silicon dioxide, and the third dielectric comprises silicon dioxide.

12. The semiconductor structure recited in claim 1 wherein the first dielectric comprises silicon nitride.

13. The semiconductor structure recited in claim 1 wherein the second dielectric comprises silicon dioxide.

14. The semiconductor structure recited in claim 1 wherein the first dielectric comprises aluminum oxide, the second dielectric comprises silicon dioxide, and the third dielectric comprises silicon dioxide.

15. The semiconductor structure recited in claim 1 wherein the first dielectric comprises aluminum oxide.

16. The semiconductor structure recited in claim 1 where the first dielectric comprises aluminum oxide and silicon nitride, the second dielectric comprises silicon dioxide, and the third dielectric comprises silicon dioxide.

17. The semiconductor structure recited in claim 1 wherein the second dielectric comprises benzocyclobutene (BCB), or SiCOH or a copolymer of butylnorbornene and triethoxysilyl norbornene or a combination thereof.

18. The semiconductor structure recited in claim 1 wherein the third dielectric comprises silicon nitride and silicon dioxide.

19. The semiconductor structure recited in claim 18 wherein the silicon nitride is in contact with the second dielectric.

20. The semiconductor structure recited in claim 1 where the second dielectric material is air.

21. The semiconductor structure recited in claim 1 wherein the second dielectric is air.

22. The semiconductor structure recited in claim 1 including a fourth dielectric disposed between the first dielectric and the third dielectric and wherein the second dielectric is disposed between: the third dielectric and the lower, vertically extending stem portion; and between the upper, horizontal portion and the fourth dielectric.

23. The semiconductor structure recited in claim 1 wherein the dielectric constant of the second dielectric is lower than the dielectric constant of the first dielectric.

24. The semiconductor structure recited in claim 1 wherein the first dielectric and second dielectric are horizontal and planar between a pair of ohmic contact structures and the second dielectric has a portion extending vertically at a vertical sidewall edge of each one of the ohmic contact structures.

25. The semiconductor structure recited in claim 24 wherein the third dielectric is planar between the pair of ohmic contact structures.

26. The semiconductor structure recited in claim 25 wherein the third dielectric is horizontal and planar between the pair of ohmic contact structures and has a portion extending vertically in contact with vertically disposed portions of the second dielectric.

27. The semiconductor structure recited in claim 26 wherein a portion of the second dielectric is disposed horizontally in contact with tops of the pair of ohmic contact structures.

28. The semiconductor structure recited in claim 27 wherein a portion of the third dielectric is disposed horizontally in contact with a top of the second dielectric above the tops of the pair of ohmic contact structures.

29. The semiconductor structure recited in claim 24 wherein the portion of the second dielectric is disposed horizontally in contact with tops of the ohmic contact structures.

30. The semiconductor structure recited in claim 24 wherein the first dielectric has portions with vertical sidewalls terminating in contact with the vertically extending portion of the gate electrode and the pair of ohmic contact structures.

31. A semiconductor structure, comprising:
a Group III-N semiconductor;
a first dielectric disposed in direct contact with the Group III-N semiconductor;
a second dielectric disposed over the first dielectric, the first dielectric having a higher dielectric constant that the second dielectric;
a third dielectric disposed above the first dielectric, such third dielectric being in contact with the second dielectric;
a gate electrode contact structure comprising:
a lower, vertically extending stem portion, sidewalls of the stem portion passing through, and in contact with, a portion of the first dielectric, a portion of the second dielectric, a bottom of the stem portion being in contact with the Group III-N semiconductor; and
an upper, horizontal portion disposed on a top portion of the lower, vertically extending stem portion, a portion of the upper, horizontal portion extending horizontally beyond the lower, vertically extending stem portion; and
an electrical interconnect structure having side portions passing through and in contact with the third dielectric and having a bottom portion in contact with the upper, horizontally portion of the gate electrode contact, wherein the portion of the upper, horizontal portion extending horizontally beyond the lower, vertically extending stem portion is disposed over both a portion of the second dielectric and a portion of the first dielectric disposed under the second dielectric, and wherein the upper, horizontal portion terminates at the third dielectric.

32. The semiconductor structure recited in claim 31 wherein the electrical interconnect structure comprises a copper damascene interconnect structure.

33. The semiconductor structure recited in claim 31 wherein the gate electrode contact comprises TiN and W or Ta or TaN or a combination thereof.

34. A semiconductor structure, comprising:
a Group III-N semiconductor;
a first dielectric disposed in direct contact with the Group III-N semiconductor;
a second dielectric disposed over the first dielectric, the first dielectric having a higher dielectric constant that the second dielectric;
a third dielectric disposed above the first dielectric, such third dielectric being in contact with the second dielectric; and
a gate electrode contact structure comprising:
a lower, vertically extending stem portion, sidewalls of the stem portion passing through, and in contact with, a portion of the first dielectric, a portion of the second dielectric, a bottom of the stem portion being in contact with the Group III-N semiconductor; and
an upper, horizontal portion disposed on a top portion of the lower, vertically extending stem portion, a portion of the upper, horizontal portion extending horizontally beyond the lower, vertically extending stem portion,
wherein the portion of the upper, horizontal portion extending horizontally beyond the lower, vertically extending stem portion is disposed over both a portion of the second dielectric and a portion of the first dielectric disposed under the second dielectric,
wherein the upper, horizontal portion terminates at the third dielectric,
wherein the gate electrode contact comprises Ni, and
wherein a copper damascene interconnect structure is disposed above the gate electrode contact.

* * * * *